(12) United States Patent
Kitamura et al.

(10) Patent No.: US 11,776,640 B2
(45) Date of Patent: Oct. 3, 2023

(54) DATA CONVERSION WITH DATA PATH CIRCUITS FOR USE IN DOUBLE SENSE AMP ARCHITECTURE WITH FRACTIONAL BIT ASSIGNMENT IN NON-VOLATILE MEMORY STRUCTURES

(71) Applicant: SanDisk Technologies LLC, Addison, TX (US)

(72) Inventors: Kei Kitamura, Kanagawa (JP); Yuki Fujita, Kanagawa (JP); Kyosuke Matsumoto, Kanagawa (JP); Masahiro Kano, Kanagawa (JP); Minoru Yamashita, Kanagawa (JP); Ryuji Yamashita, Tokyo (JP); Shuzo Otsuka, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 149 days.

(21) Appl. No.: 17/511,749

(22) Filed: Oct. 27, 2021

(65) Prior Publication Data
US 2023/0131117 A1    Apr. 27, 2023

(51) Int. Cl.
| | | |
|---|---|---|
| *G11C 16/26* | (2006.01) | |
| *G11C 16/34* | (2006.01) | |
| *G11C 16/04* | (2006.01) | |
| *G06F 3/06* | (2006.01) | |
| *G11C 16/08* | (2006.01) | |

(52) U.S. Cl.
CPC ........ *G11C 16/3431* (2013.01); *G06F 3/0679* (2013.01); *G11C 16/0483* (2013.01); *G11C 16/26* (2013.01); *G11C 16/08* (2013.01)

(58) Field of Classification Search
CPC . G11C 16/3431; G11C 16/0483; G11C 16/26; G11C 16/08; G06F 3/0679
USPC ...................................... 365/185.25
See application file for complete search history.

(56) References Cited

U.S. PATENT DOCUMENTS

| | | | |
|---|---|---|---|
| 10,825,526 B1 * | 11/2020 | Li | ........................ G11C 16/24 |
| 10,832,789 B1 * | 11/2020 | Gupta | .................... G11C 16/10 |
| 2010/0209720 A1 * | 8/2010 | Greener | ................. C23C 18/31 427/576 |
| 2020/0364138 A1 * | 11/2020 | Howe | ................. G06F 12/0215 |

* cited by examiner

*Primary Examiner* — Huan Hoang
*Assistant Examiner* — Minh Dinh
(74) *Attorney, Agent, or Firm* — DICKINSON WRIGHT PLLC; Steven C. Hurles

(57) ABSTRACT

A method for programming a non-volatile memory structure, comprises initiating a two-dimensional fractional number of bits-per-cell programming scheme of a plurality of memory cells, wherein the memory structure comprises: (1) a first memory array comprising a first population of memory cells and the associated peripheral circuitry disposed below the first population of cells, (2) a second memory array positioned above the first memory array and comprising a second population of memory cells and associated peripheral circuitry disposed above the second population of cells, and (3) a data bus tap electrically coupling the first and second memory arrays. Further, the method comprises: (1) storing input data in data latches associated with the first array and with the second array. Additionally, the method comprises converting the stored data using data conversion logic implemented by a data path circuit of the first and second arrays and rewriting the converted data to the latches.

20 Claims, 27 Drawing Sheets

DATA CONVERSION WITH DATA PATH CIRCUITS FOR USE IN DOUBLE SENSE AMP ARCHITECTURE WITH FRACTIONAL BIT ASSIGNMENT IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems, methods, and device architectures for implementing a fractional number of bits-per-cell programming scheme with respect to non-volatile memory structures.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as binary data), the possible threshold voltages ($V_{th}$) of the memory cell are divided into two ranges, wherein the ranges are assigned as logical data "1" and "0" respectively. A memory cell characterized by this type of storage density may be referred to as a "single-level cell" or SLC.

By further partitioning the threshold voltage window of a memory cell into additional distinct voltage ranges, multiple levels of information can be stored. Such a memory cell may be referred to as a "multi-state cell." For example, to store two bits of data, the threshold voltage window of a cell may be partitioned into four distinct voltage ranges (or states), wherein each range is assigned a certain bit value that is equal to, for example, "11," "10," "01," and "00." Accordingly, after an erase operation, the threshold voltage is negative and, therefore, may be defined as logic "11." Therefore, the positive threshold voltages may be used for the states of "10," "01," "00." A memory cell of this storage density may be referred to as, for example, a "multi-level cell" or MLC. In another example, to store three bits of data, the voltage threshold window of a cell may be partitioned into eight distinct voltage ranges (or states), wherein each range is assigned a certain bit value that is equal to, for example, "111," "110," "100," "010," "011," "000," "001," and "101." A memory cell of this storage density may be referred to, for example, as a "tri-level" or "triple-level cell" (TLC). In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

The specific relationship between the data that is programmed into a memory cell and the threshold voltage levels of the memory cell depends upon the data encoding scheme that is adopted for the memory cells.

Thus, a memory device that comprises multi-state data (by incorporating MLC and/or TLC, etc., type cells) has an increased storage capacity using the same MOSFET structure and wafer size as an SLC-type cell and, as a result, provides a comparative cost per bit savings. However, as a consequence of the increased density and the tightened tolerances between the partitioned voltage ranges of multi-state memory cells, programming occurs at a slower speed relative to a single-state memory cell because the data is being programmed to multiple target threshold voltage ranges and requires a higher level of precision during programming. The increased density of a multi-state memory cell decreases the margin of error that exists between state changes and reduces the available voltage range capacity that is needed to endure the stress on the silicon oxide layer over successive programming/erase (P/E) cycles. As a result, in comparison to single-state memory cell, the durability of a multi-state storage element is significantly lower.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure. However, the lack of separation between the charge trapping regions of the memory cells in three-dimensional array structures provide further challenges with respect to the reliability and the retention of the programmed data.

Accordingly, as the industry continues to achieve smaller sized memory cells with increased storage densities in order to store more data, this scaling of size entails certain performance degradation and durability risks. Thus, it would be beneficial to derive various methods and operating schemes (e.g., two-dimensional fractional number of bits-per-cell programming assignments), as well as memory device architectures and configurations that improve the efficiency and reliability of the memory operations while maintaining a desired storage density or capacity.

SUMMARY

Various embodiments include a method for programming a non-volatile memory structure. The method comprises initiating a two-dimensional fractional number of bits-per-cell programming scheme with respect to a plurality of memory cells of a memory structure, wherein the memory structure comprises: (1) a first memory array comprising a first population of the plurality of memory cells and associated peripheral circuitry, wherein the associated peripheral circuitry is disposed below the first population of the plurality of memory cells, (2) a second memory array positioned above the first memory array and comprising a second population of the plurality of memory cells and associated peripheral circuitry, wherein the associated peripheral circuitry is disposed above the second population of the plurality of memory cells, and (3) a data bus tap electrically coupling the first memory array and the second memory array. Further, the method comprises storing input data: (1) in a first set of data latches associated with the first memory array, and (2) in a second set of data latches associated with the second memory array. In addition, the method comprises then converting the input data stored in the first set of data latches and second set of data latches using data conversion logic that is implemented by: (1) a data path circuit of the peripheral circuitry associated with the first memory array, and (2) a data patch circuit of the peripheral circuitry associated with the second memory array; and thereafter rewriting the converted data to the first set and second set of data latches.

Other embodiments include a memory controller comprising a first communication pathway configured to couple to a non-volatile memory structure, wherein the controller is configured to initiate a two-dimensional fractional number of the bits-per-cell programming scheme with respect to a plurality of memory cells of the memory structure, wherein the memory structure comprises: (1) a first memory array comprising a first population of the plurality of memory cells and associated peripheral circuitry, wherein the associated peripheral circuitry is disposed below the first population of the plurality of memory cells, (2) a second memory array positioned above the first memory array and comprising a second population of the plurality of memory cells and associated peripheral circuitry, wherein the associated peripheral circuitry is disposed above the second population of the plurality of memory cells, and (3) a data bus tap electrically coupling the first memory array and second memory array. Further, the controller is configured to store input data in: (1) a first set of data latches that are associated with the first memory array, and (2) a second set of data latches that are associated with the second memory array. The controller is configured to then convert the input data stored in the first set of data latches and second set of data latches using data conversion logic that is implemented by: (1) a data path circuit of the peripheral circuitry associated with the first memory array, and (2) a data patch circuit of the peripheral circuitry associated with the second memory array; and rewrite the converted data to the first set and second set of data latches.

Additional embodiments include a non-volatile memory system comprising a memory structure and a memory controller coupled to the memory structure, with the memory controller: (1) initiating a two-dimensional fractional number of bits-per-cell programming scheme with respect to a plurality of memory cells; (2) storing input data in a first set of data latches that are associated with a first memory array of the memory structure and in a second set of data latches associated with a second memory array of the memory structure; (3) converting the input data stored in the first set of data latches and the second set of data latches using data conversion logic that is implemented by a data path circuit of the peripheral circuitry associated with the first memory array, and a data patch circuit of the peripheral circuitry associated with the second memory array; (4) rewriting the converted data to the first set and the second set of data latches. The (1) first memory array comprises a first population of a plurality of memory cells and associated peripheral circuitry that is disposed below the first population of the plurality of memory cells, (2) the second memory array is positioned above the first memory array and comprises a second population of the plurality of memory cells and the associated peripheral circuitry that is disposed above the second population of the plurality of memory cells, and (3) a data bus tap electrically coupling the first memory array and second memory array.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
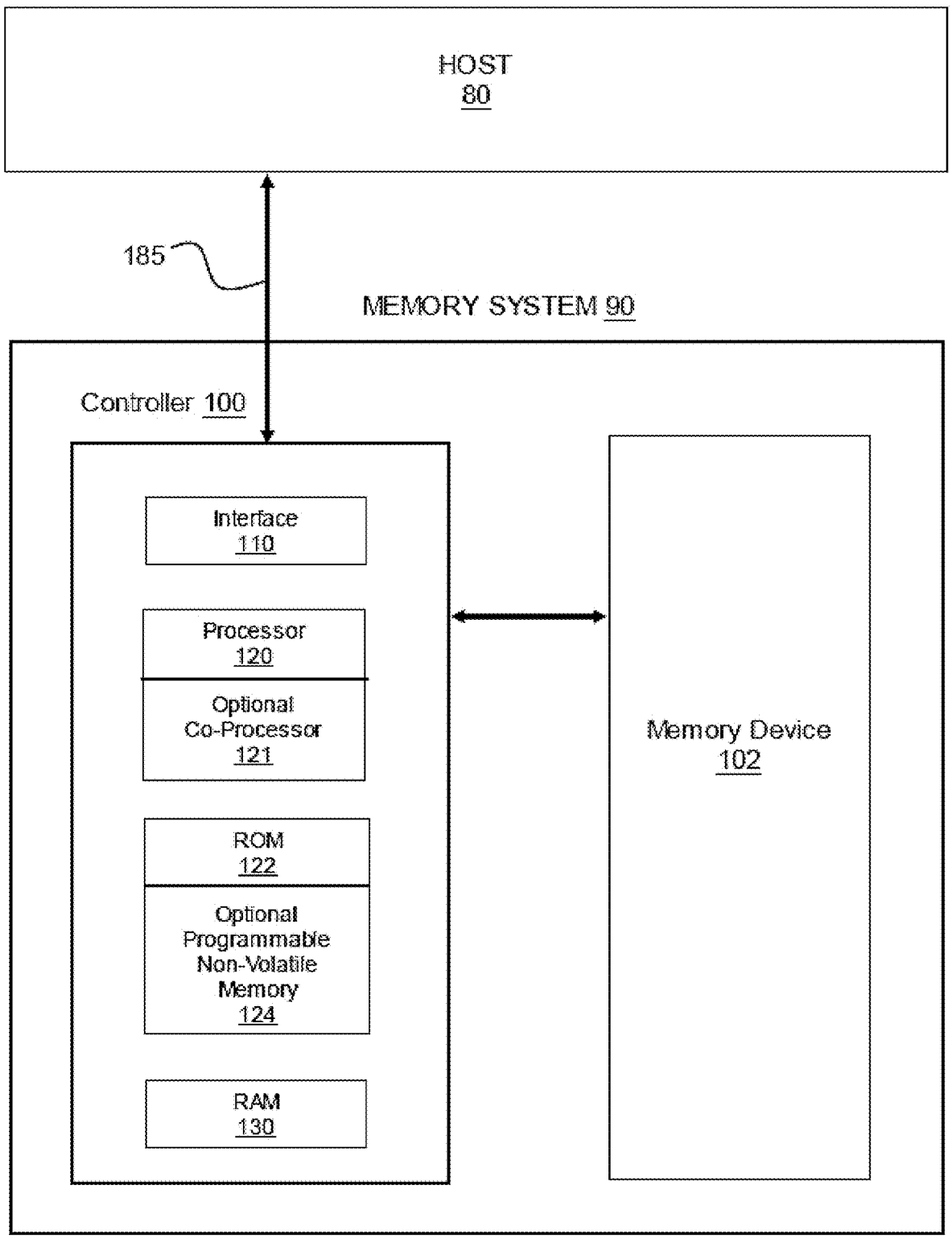
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically-written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
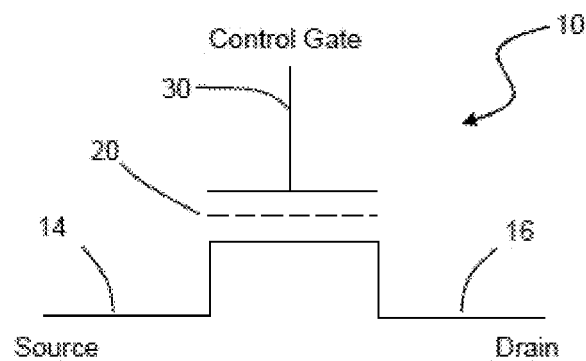
FIG. 2 is a schematic depiction of a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a bit line.

Figure 3:
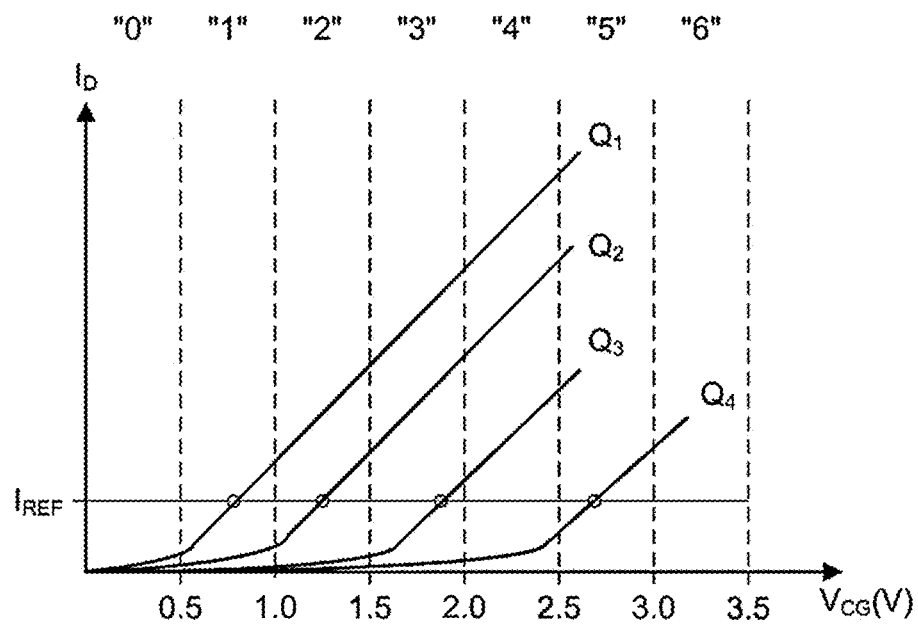
FIG. 3 depicts the relationship between a source-drain current $I_D$ and a control gate voltage $V_{CG}$ for four different charges Q1-Q4 that a floating gate of a non-volatile memory cell may be selectively storing at any one time and at a fixed drain voltage, in accordance with exemplary embodiments.

FIG. 3 provides a graphical illustration of the correlation between the source-drain current $I_D$ and control gate voltage $V_{CG}$ for, for example, a non-volatile memory cell 10 having four different charge states Q1-Q4 that the floating gate may be selectively storing at any given time. As shown, with a fixed drain voltage bias, there exists four solid $I_D$ versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 µA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from –1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
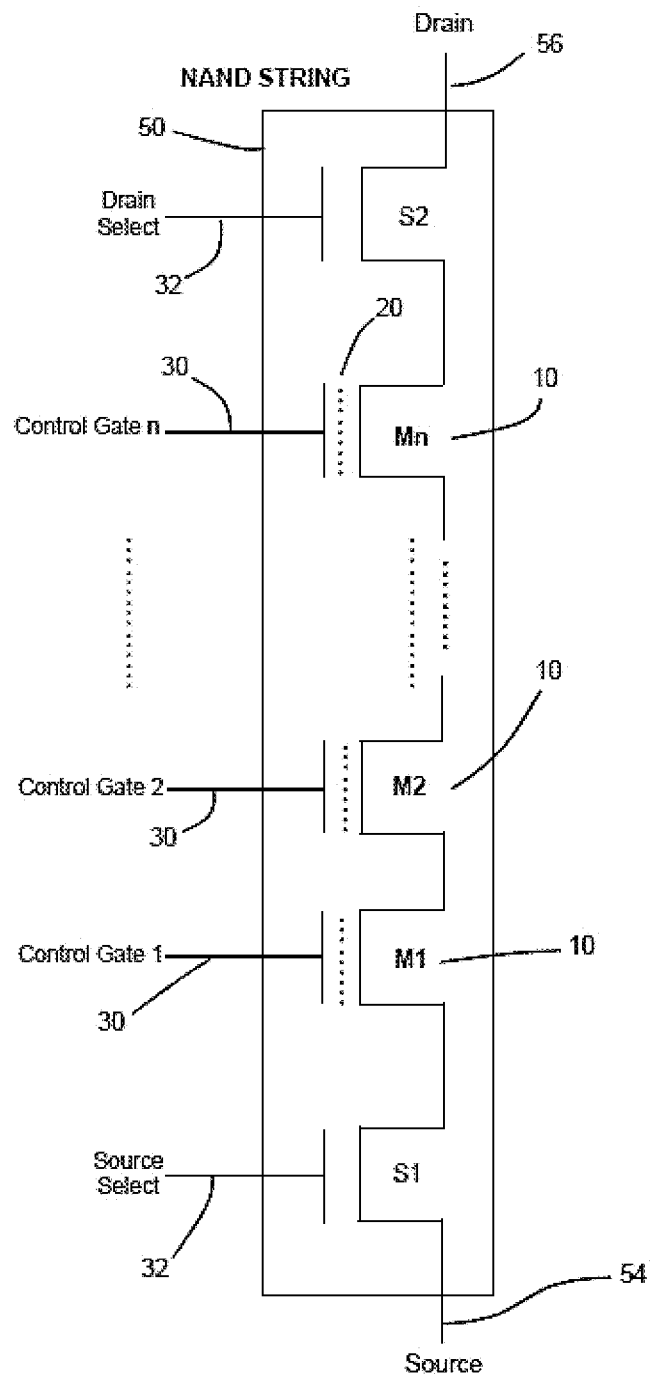
FIG. 4A schematically depicts a series of NAND-type memory cells that are organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, . . . , Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
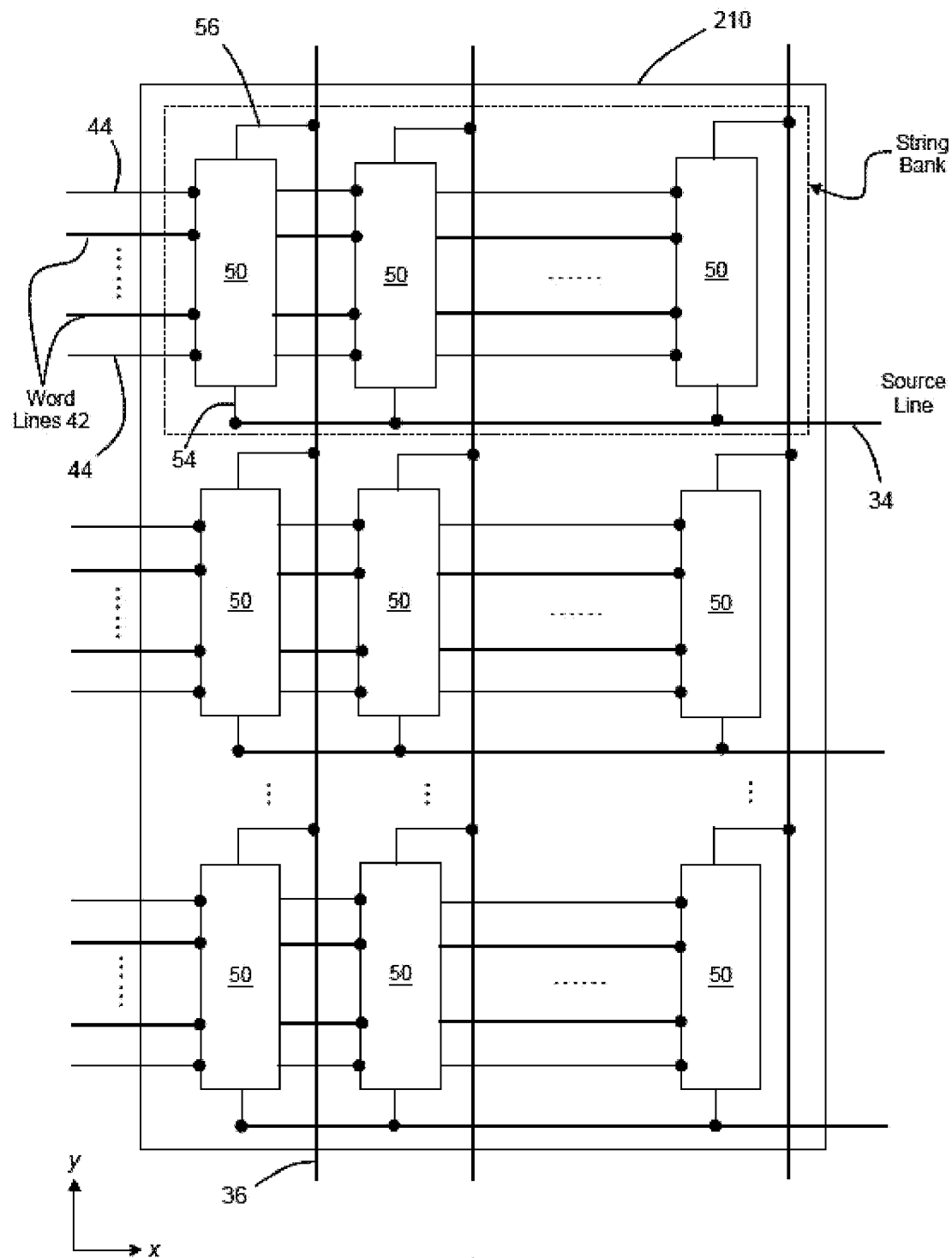
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
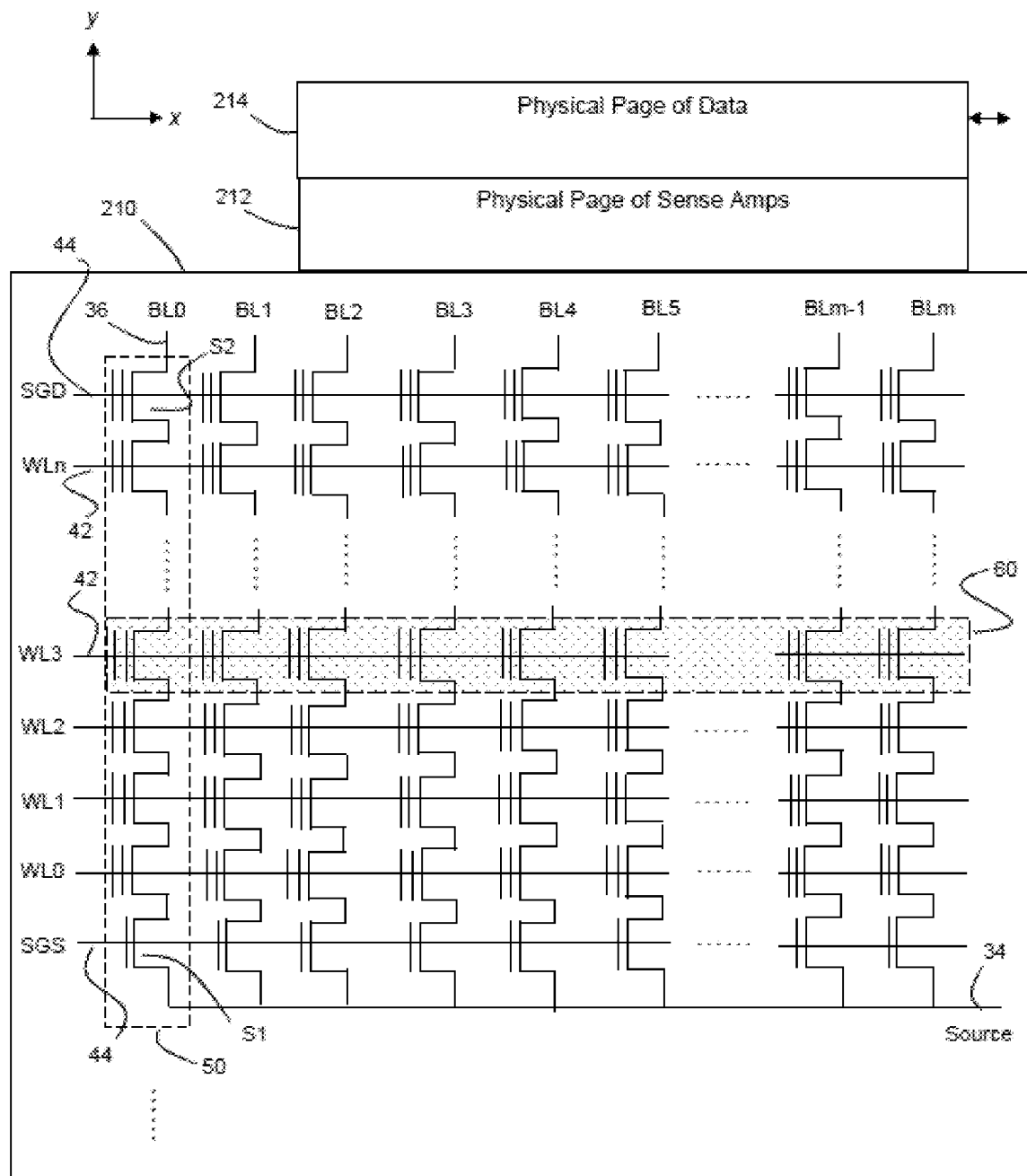
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, . . . , BLm–1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6:
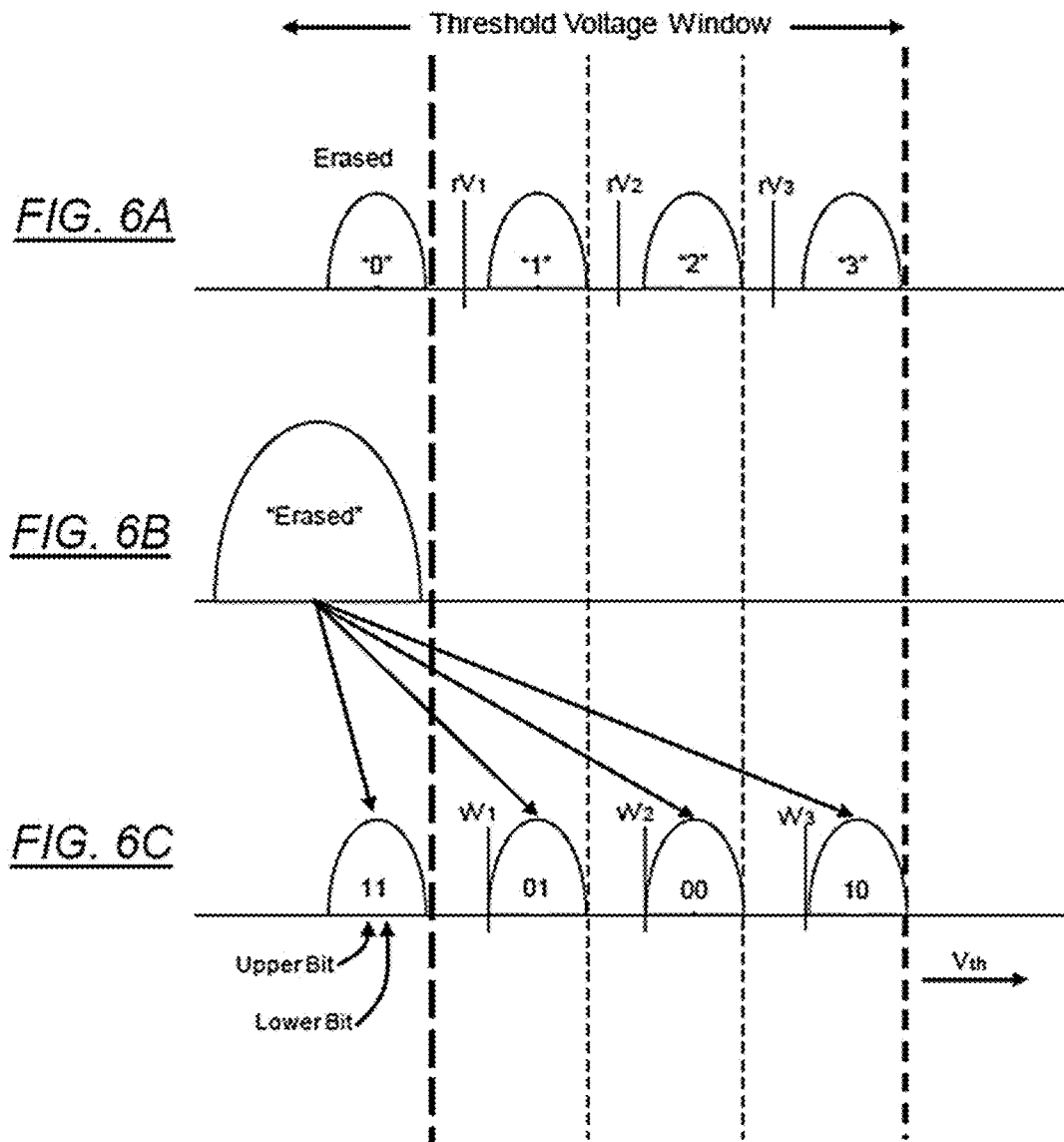
FIGS. 6A-6C depict stages of programming four states of a population of MLC NAND-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages $rV_1$, $rV_2$, and $rV_3$ in three sub-passes respectively.

Figure 7:
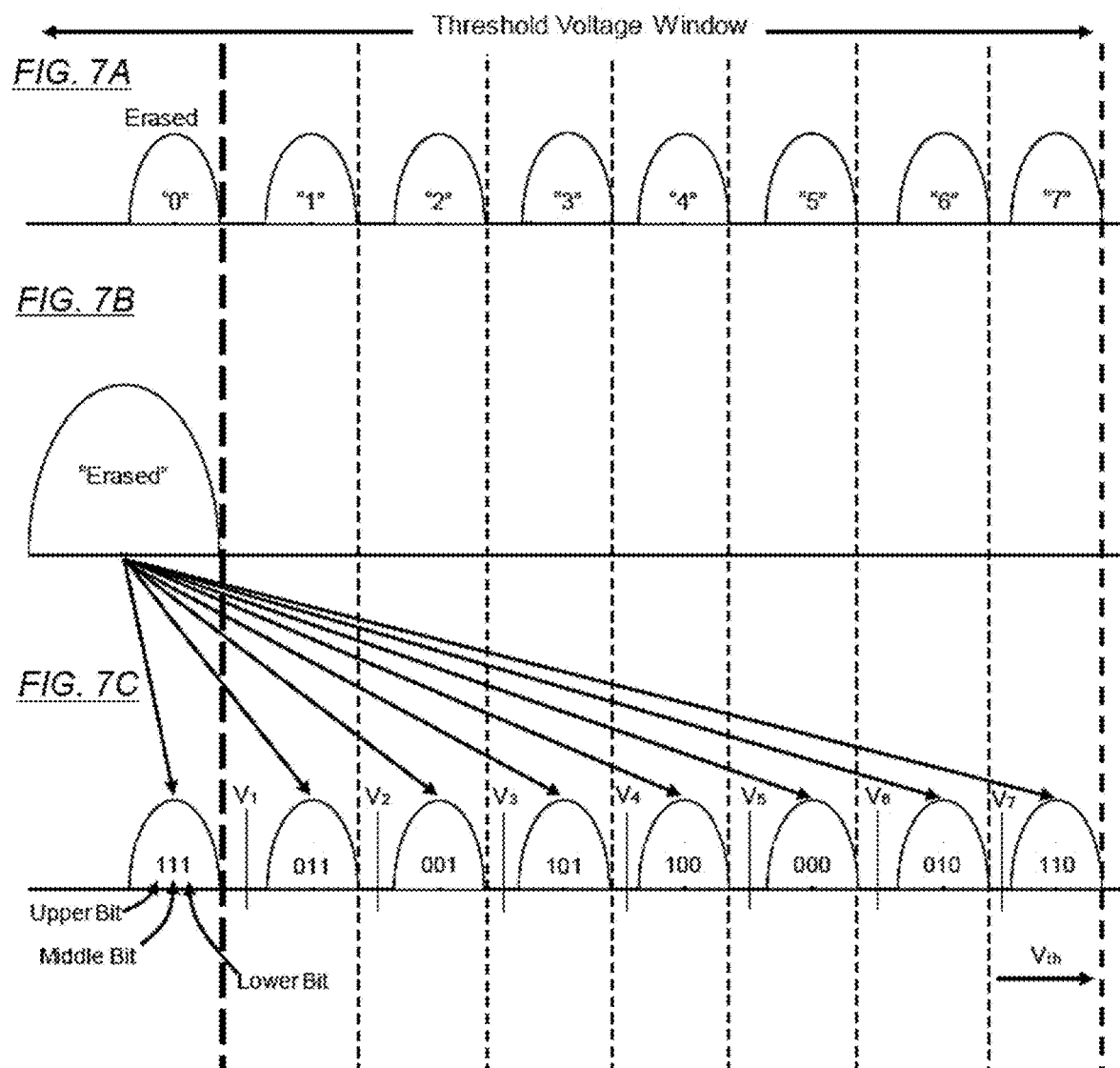
FIGS. 7A-7C depict stages of programming eight states of a population of TLC NAND-type memory cells, in accordance with exemplary embodiments.

Similarly, FIGS. 7A-7C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 7A). Thus, FIG. 7B depicts an initial distribution of "erased" threshold voltages for an erased memory. Further, FIG. 7C depicts an example of the memory after many of the memory cells have been programmed. As a result, a cell's threshold voltage is moved higher into one of the distinct voltage ranges demarcated by levels $V_1$, $V_2$, $V_3$, $V_4$, $V_5$, $V_6$, and $V_7$. Accordingly, each memory cell can be programmed to one of the seven programmed states "1" through "7," or can remain unprogrammed in the "erased" state. As a consequence of the programming, the initial distribution of the "erased" state as shown in FIG. 7B becomes narrower as indicated by the "0" state in FIG. 7C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values V1 through V7 in seven sub-passes respectively.

Figure 8:
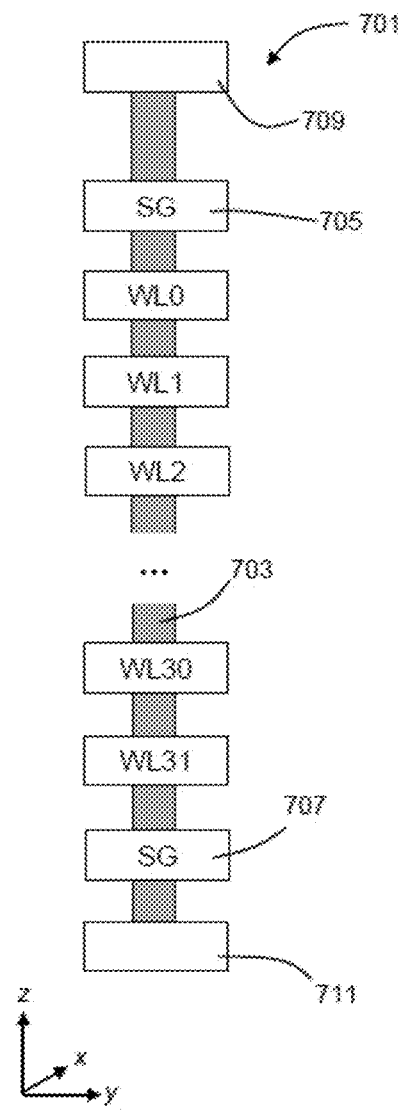
FIG. 8 depicts a vertical NAND-type string in accordance with an exemplary embodiment.

In FIGS. 4A-4B and 5 and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 8 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 8, the vertical NAND-type string 701 has 32 memory cells (i.e., at the juncture between local bit line 703 and word lines 0 through 31) connected in series. However, a NAND-type string 701 may comprise any suitable number of memory cells.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 9:
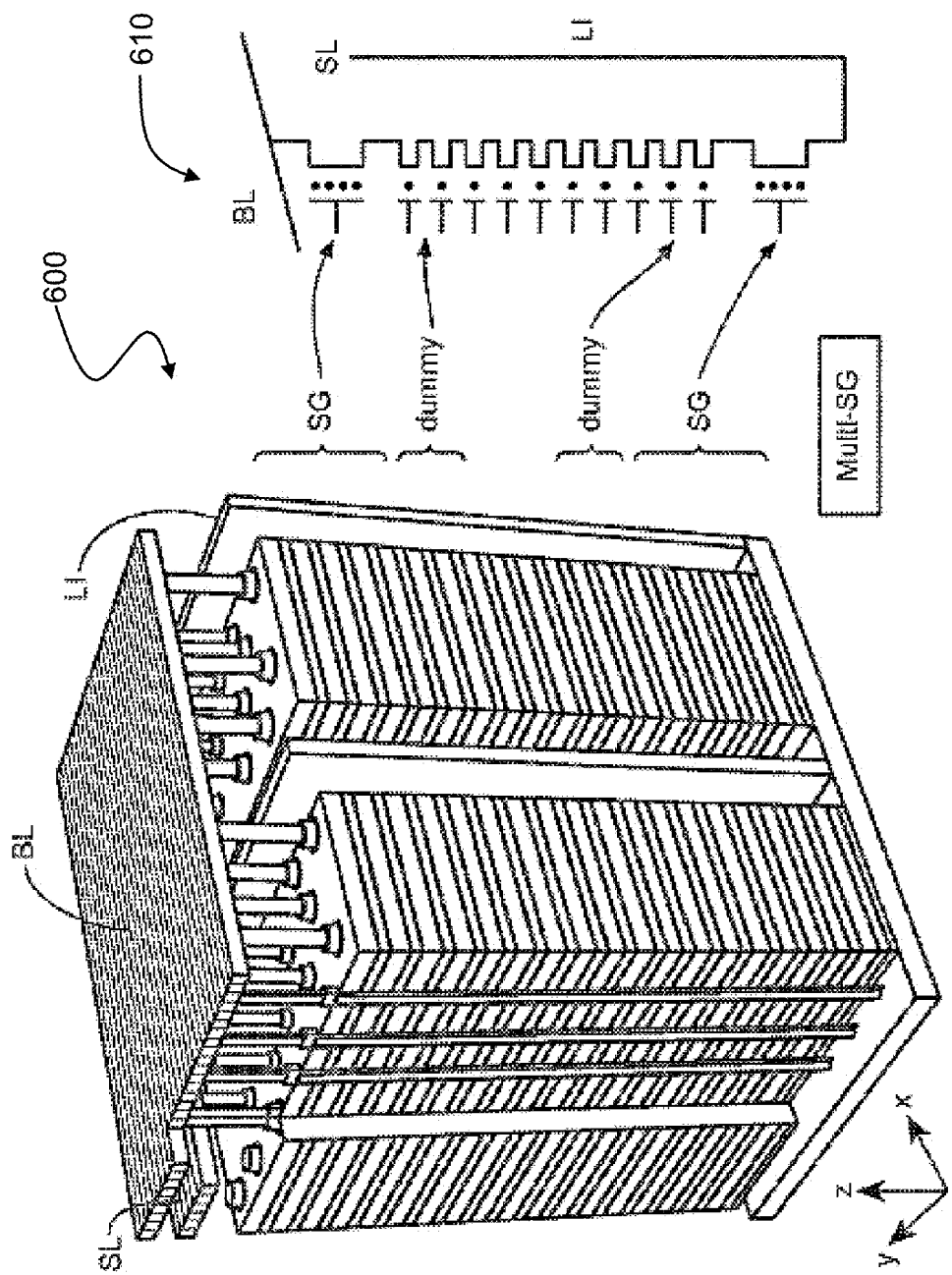
FIG. 9 is a perspective view of a representative subsection of a monolithic three-dimensional NAND-type memory array, in accordance with exemplary embodiments.

Referring now to FIG. 9, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 9 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 10:
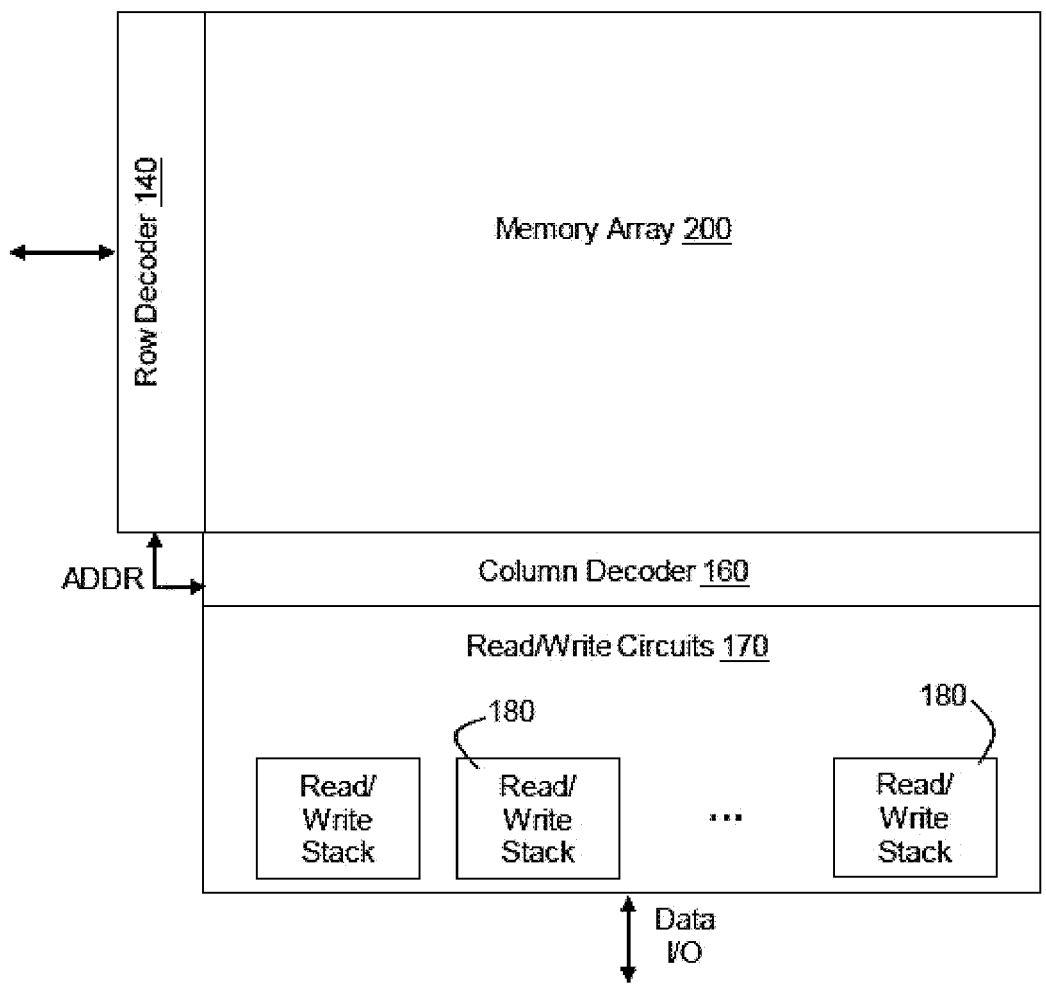
FIG. 10 schematically depicts a configuration of a non-volatile memory array that is accessible by read/write circuits via row and column decoders, in accordance with exemplary embodiments.
Figure 11:
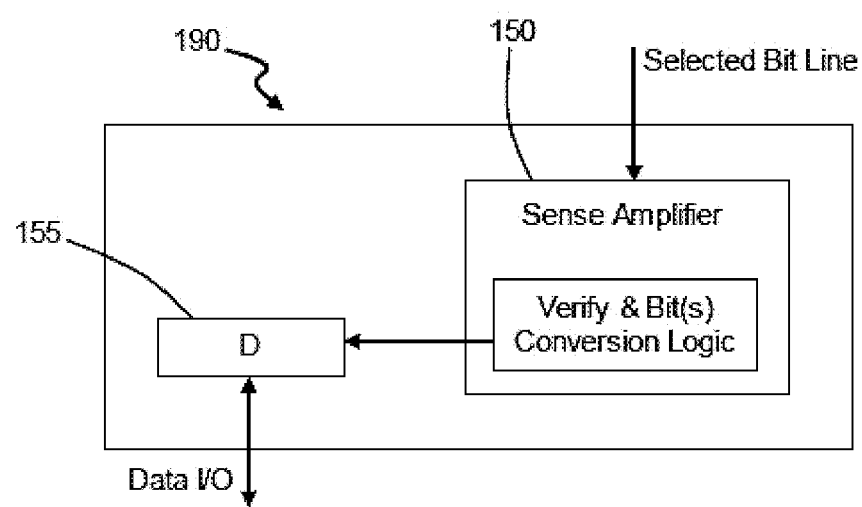
FIG. 11 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 10. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 11, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 10, the read/write circuits 170 are organized into banks of read/write stacks 180 wherein each read/write stack 180 is a stack of read/write modules 190.

Figure 12A:
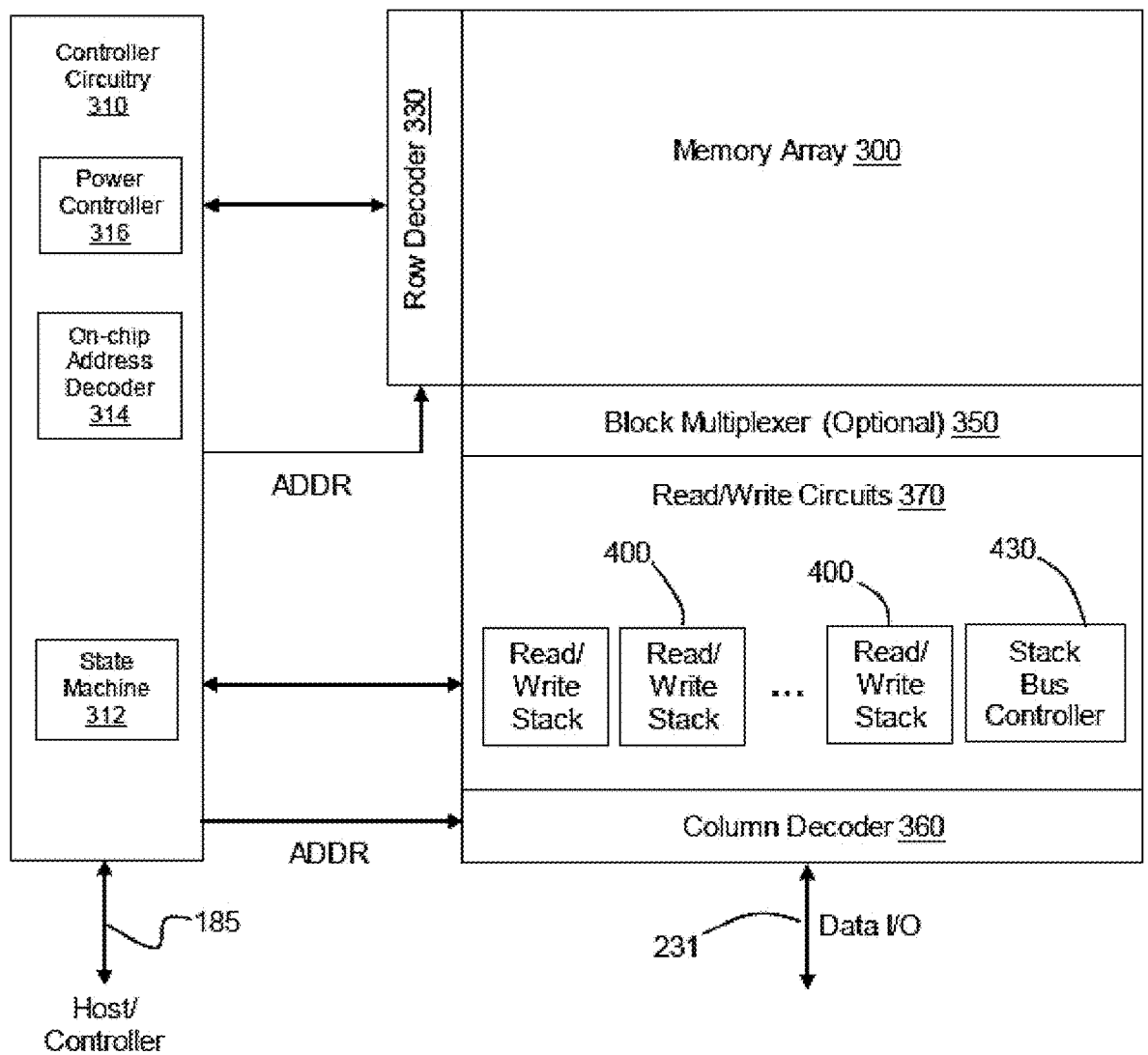
FIG. 12A schematically depicts a memory device with a bank of partitioned read/write stacks, in accordance with exemplary embodiments.

Referring now to FIG. 12A, there is shown an exemplary embodiment of a memory device (such as memory device 102 in FIG. 1, for example) that is comprised of a non-volatile memory array 300 (which may include the NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 12B:
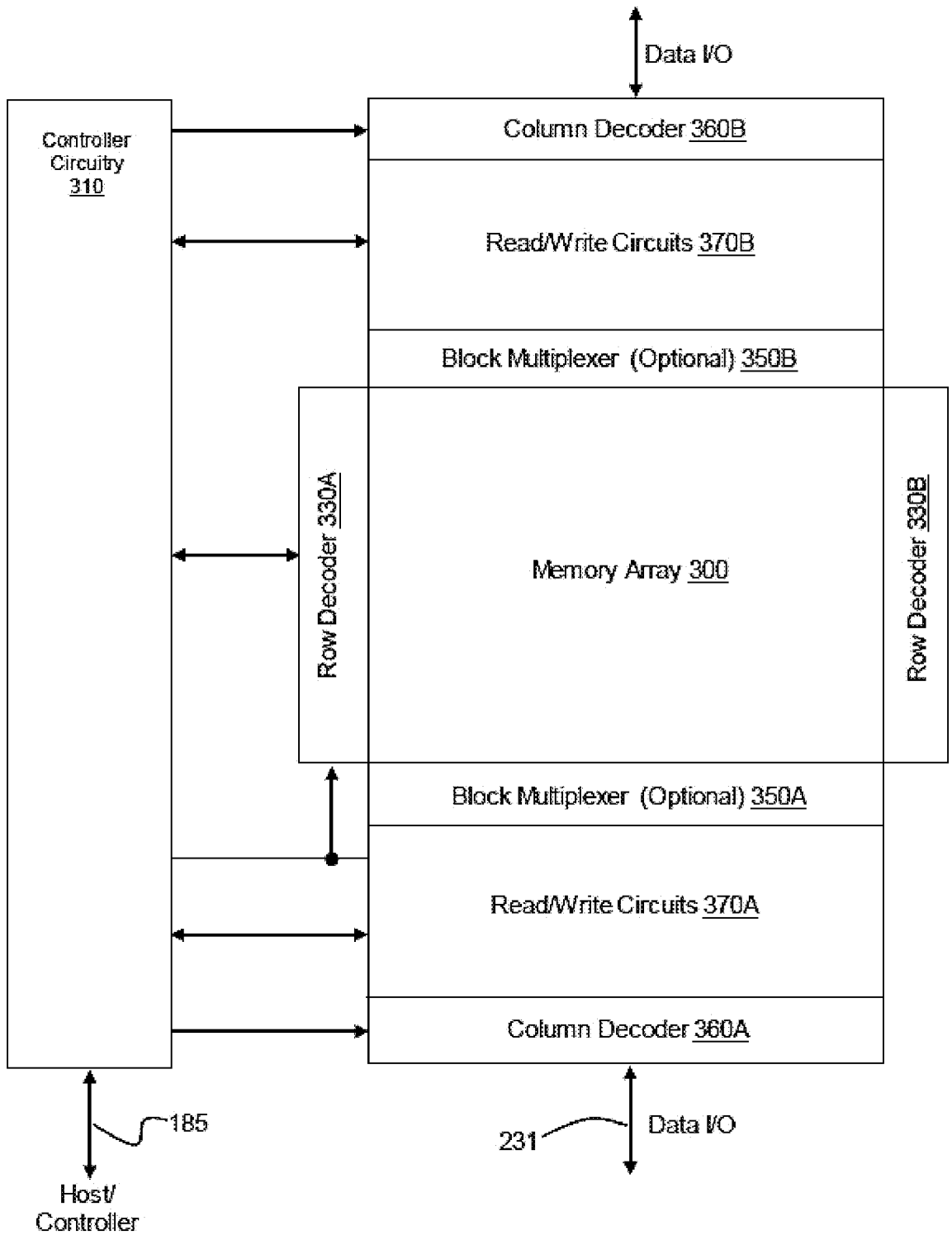
FIG. 12B schematically depicts the memory device of FIG. 11A in a slightly different configuration, in accordance with exemplary embodiments.

FIG. 12B depicts a slightly different exemplary embodiment of the memory device of FIG. 12A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 12A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 13:
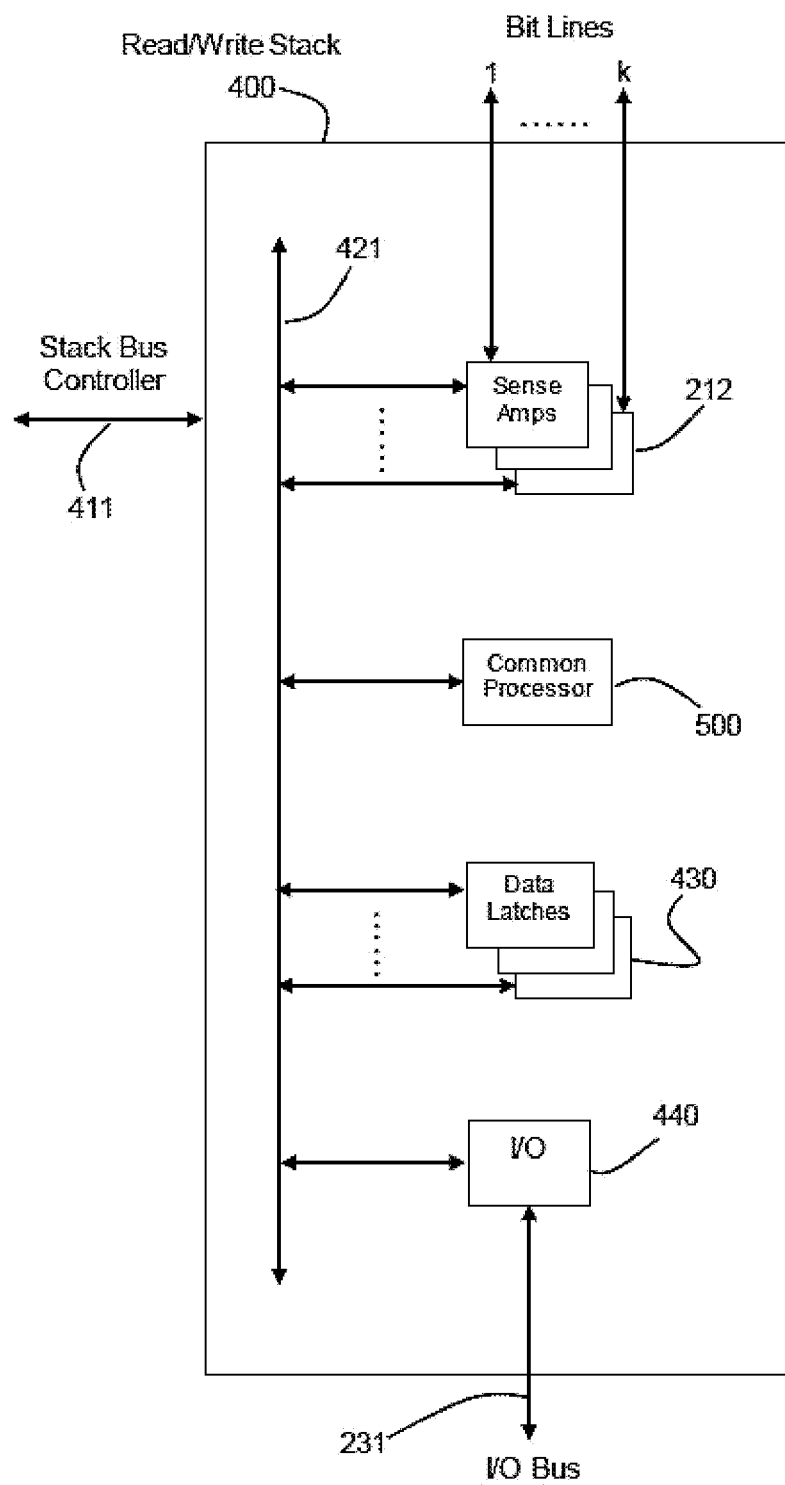
FIG. 13 schematically depicts various components of a read/write stack, such as the read/write stacks depicted in FIG. 11A, in accordance with exemplary embodiments.
Figure 14A:
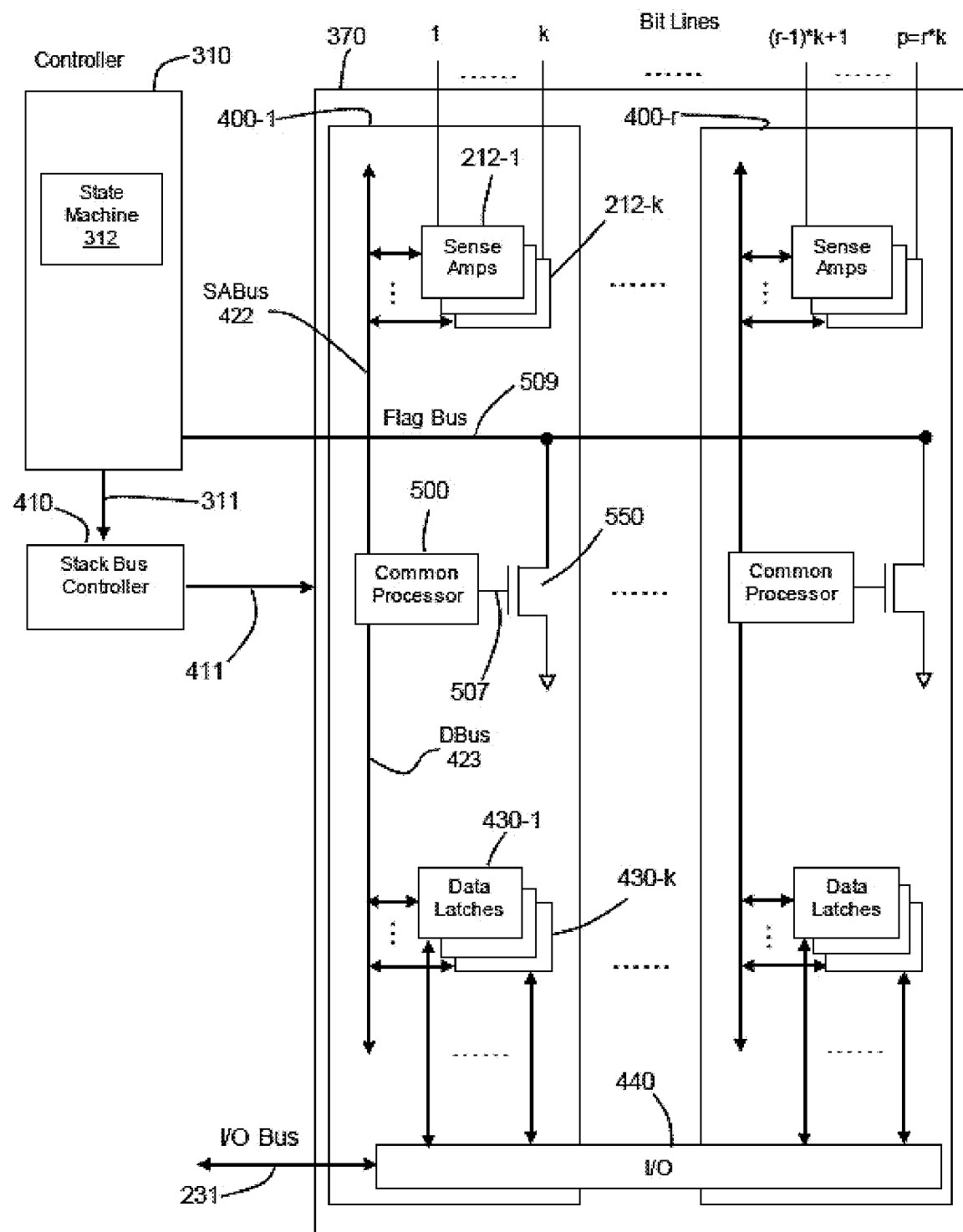
FIG. 14A schematically depicts a plurality of read/write stacks arranged amongst read/write circuits of a memory device, such as the memory device depicted in FIG. 11A, in accordance with exemplary embodiments.

Referring now to FIG. 13, there is illustrated an exemplary embodiment of certain components in a read/write stack, such as the read/write stacks 400 of FIG. 12A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 14A depicts an exemplary embodiment for incorporating the read/write stack 400 of the embodiment of FIG. 13 amongst the read/write circuits 370 of the memory devices depicted in FIGS. 12A-12B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 14A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, . . . , 212-k, and the DBus 423 provides a communication pathway between the common processor 500 and the stack of data latches 430-1, . . . , 430-k. With respect to the common processor 500, it further comprises an output 507 for output of a status signal of a memory operation, such as an error condition. As is depicted in FIG. 14A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-r.

Figure 14B:
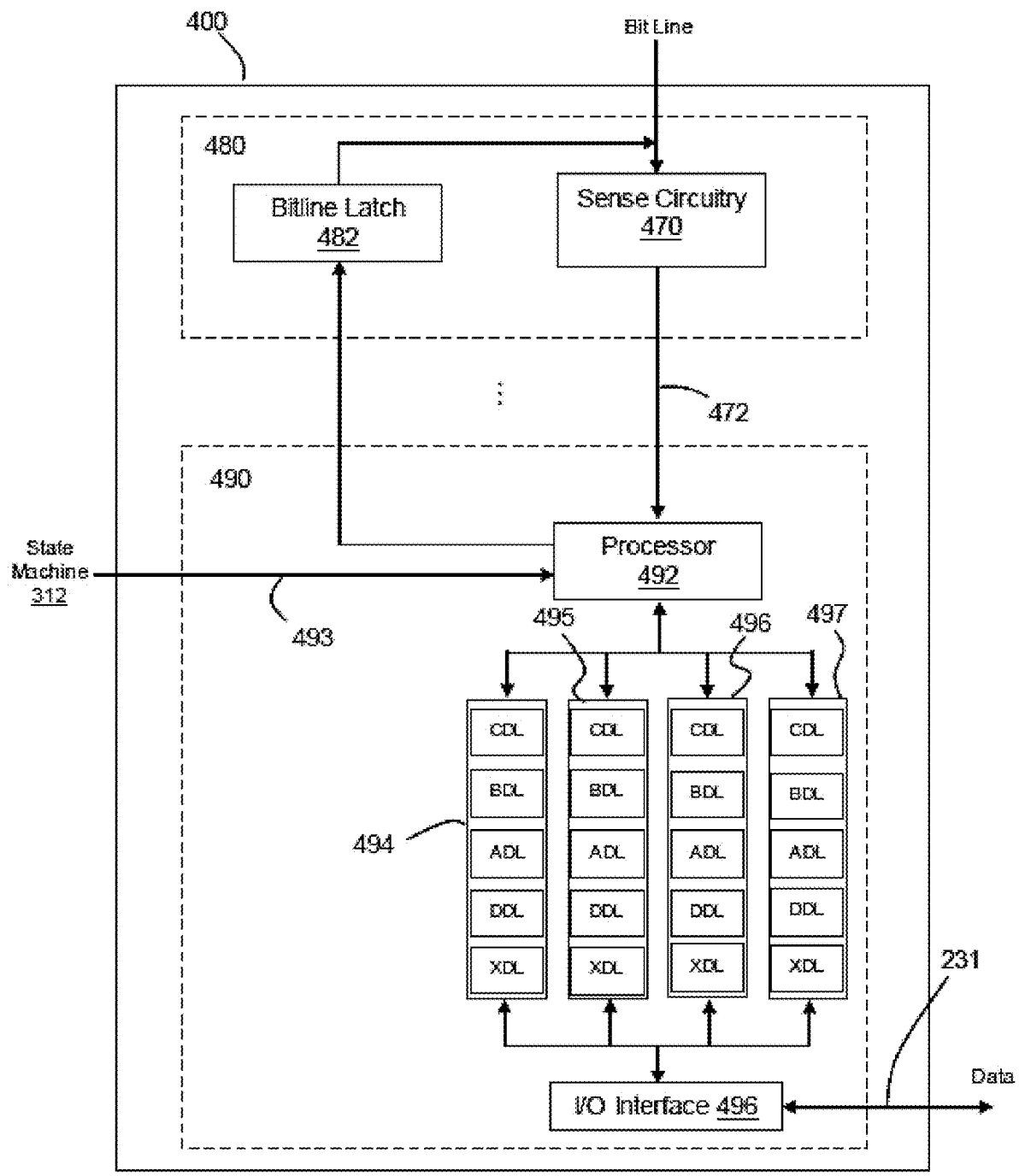
FIG. 14B is a block diagram depicting a sense block of a read/write stack, such as the read/write stacks depicted in FIG. 11A, in accordance with exemplary embodiments.

Further, an exemplary embodiment of an individual sense block (as encompassed by a read/write stack 400) is depicted in FIG. 14B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 14B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

Figure 15:
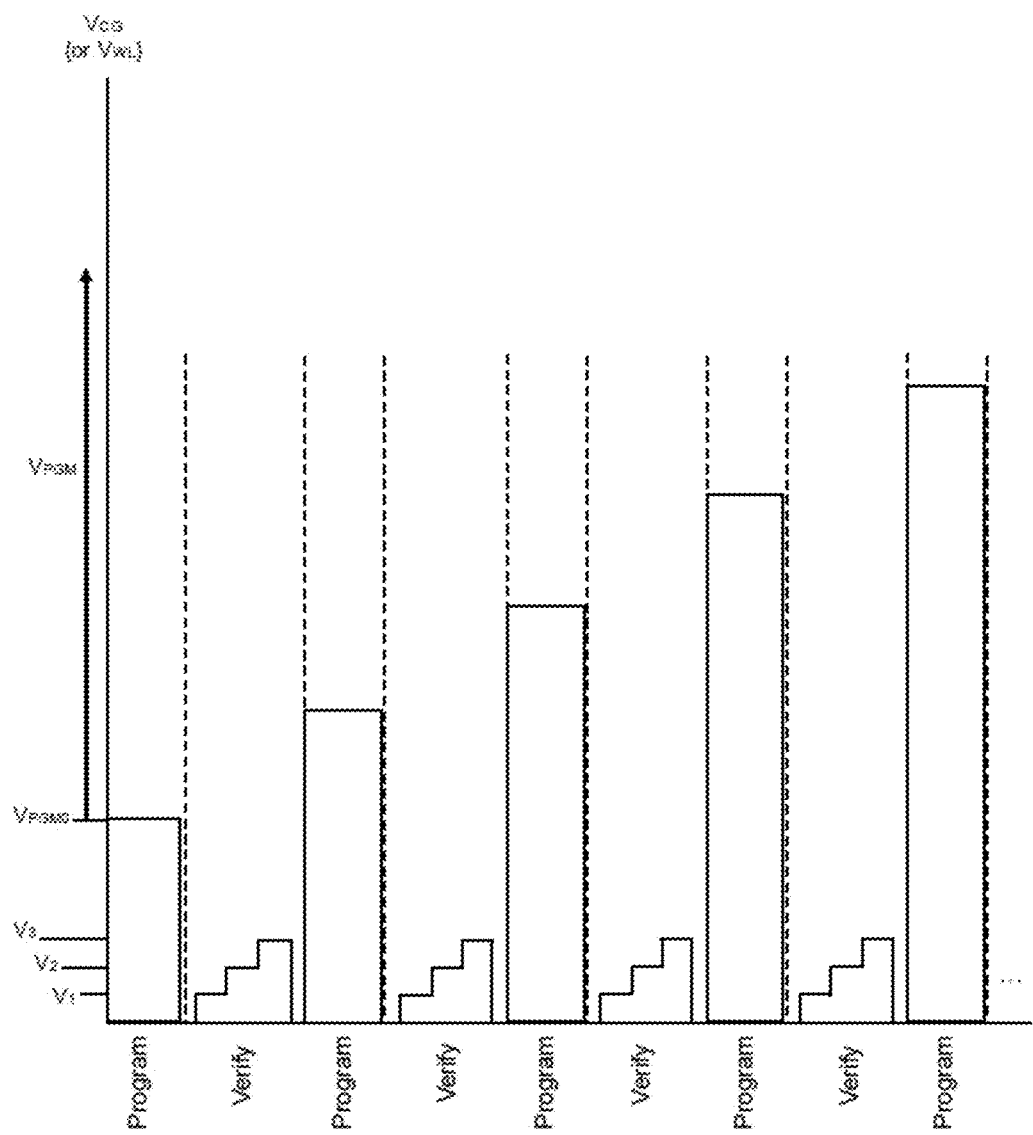
FIG. 15 illustrates a process of programming a 4-state memory cell to a target memory state, in accordance with exemplary embodiments.

An exemplary embodiment of a process for programming a 4-state memory cell to a target memory state is depicted in FIG. 15. As mentioned above, during a program operation, programming circuits will apply a series of programming pulses to a selected word line of the memory array. Thus, a page of memory cells whose respective control gates are coupled to the selected word line are therefore subject to the same series of programming pulses such that the cells are programmed in unison. As illustrated in FIG. 15, the sequence of applied pulses in the programming train may have an increasing period or amplitude in order to counteract the accumulating electrons programmed in the charge storage unit of the cell being programmed. Designated as $V_{PGM}$ in FIG. 15, the programming voltage may comprise a series of pulses in the form of, for example, a staircase waveform beginning at an initial voltage $V_{PGM0}$ and increasing thereafter, wherein each pulse attempts to add incremental charges to the charge storage element of the cell. Between the programming pulses, the cell is read back to determine its threshold voltage level using one or more sensing operations. Once the threshold voltage of the cell is verified to be within the threshold voltage window of the target state, the cell is signaled as program-inhibited such that no further programming of that cell can occur. However, the other cells may continue to be subject to programming until all cells of the page have been program-verified.

Figure 16A:
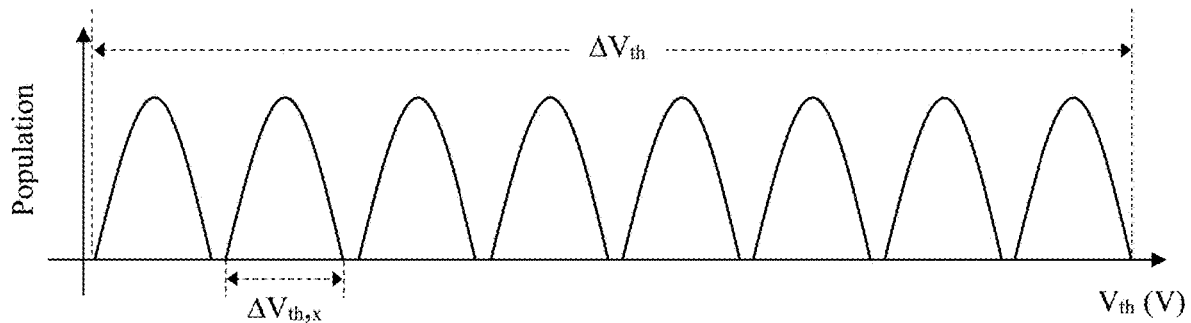
FIG. 16A is a threshold voltage ($V_{th}$) distribution plot generally depicting the eight programmable states of a population of cells having a three bits-per-cell configuration, in accordance with exemplary embodiments.
Figure 16B:
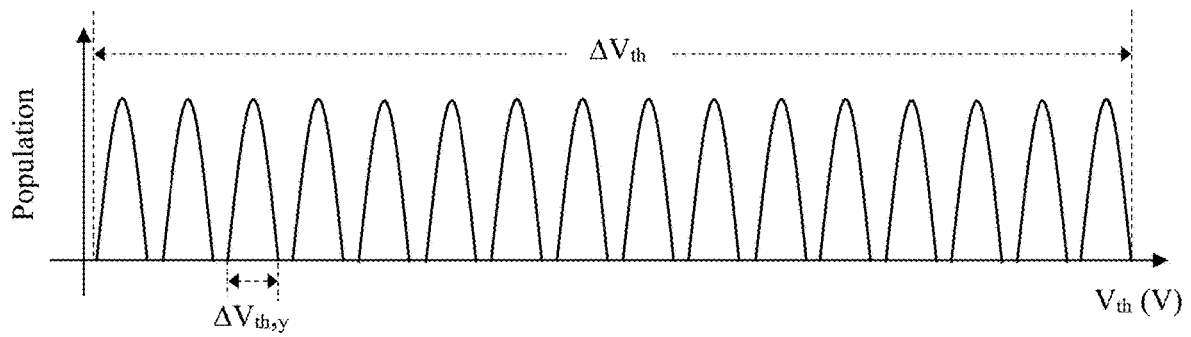
FIG. 16B is a threshold voltage ($V_{th}$) distribution plot generally depicting the 16 programmable states of a population of cells having a four bits-per-cell configuration, in accordance with exemplary embodiments.
Figure 16C:
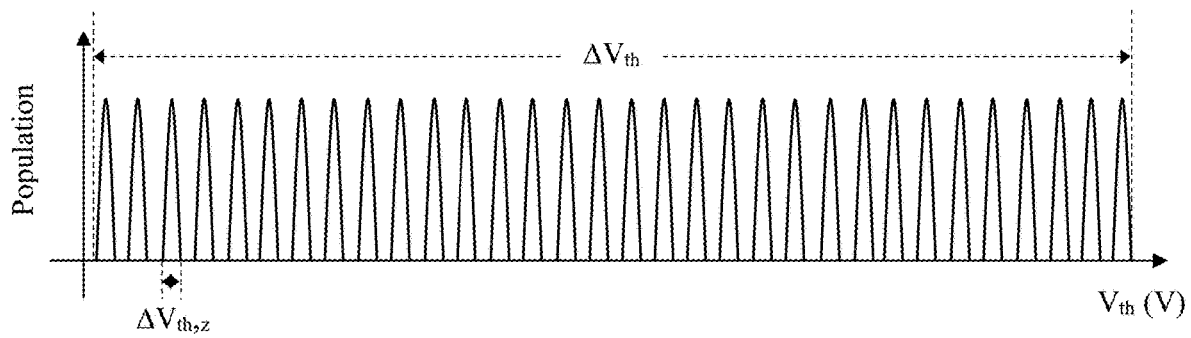
FIG. 16C is a threshold voltage ($V_{th}$) distribution plot generally depicting the 32 programmable states of a population of cells having a five bits-per-cell configuration, in accordance with exemplary embodiments.

As mentioned above, these high storage density memory structures, such as the BiCS type described, for example, with respect to the exemplary embodiment shown in FIG. 9, have relatively small spacing between adjacent memory cells and each cell has a relatively small tolerance between discrete voltage ranges for memory functions. Accordingly, improving the amount of efficient storage capability within a fixed die size has competing drawbacks and liabilities as a result of, for example, the narrowing of the threshold voltage window upon increasing the storage density as mentioned above. FIGS. 16A-16C generally illustrate the tightening of the threshold voltage window per programmable state as a direct function of the increase in storage density. Depicted in FIG. 16A is an example of a distribution plot of the threshold voltage ($V_{th}$) distribution of a population of memory cells comprising a given memory structure. In this particular example, the memory cells are of the TLC-type storage density in which three bits are stored in each cell. Accordingly, the distribution plot indicates the eight programmable states, including an "erase" state. Further, the entire available threshold voltage ($V_{th}$) range with respect to the subject memory structure is indicated in FIG. 16A as "$\Delta V_{th}$." Additionally, the width of the threshold voltage window per programmable state is indicated in FIG. 16A as "$\Delta V_{th,x}$." By contrast, FIG. 16B generally depicts a memory structure that is characterized as having the same fixed die size as the memory structure illustrated in FIG. 16A such that it exhibits an available threshold voltage ($V_{th}$) range substantially identical to that set forth in FIG. 16A as "$\Delta V_{th}$." However, the memory structure depicted in FIG. 16B has an increased storage density to four bits per cell. As such, 16 programmable states are shown. The width of the threshold voltage window per programmable state is indicated as "$\Delta V_{th,y}$." Comparatively, the width of the threshold voltage window per programmable state exhibited in the memory structure depicted in FIG. 16B is clearly narrower than the width of the threshold voltage window per programmable state of the memory structure that is depicted in FIG. 16A (thus, $\Delta V_{th,x} > \Delta V_{th,y}$). In further contrast, FIG. 16C generally illustrates a memory structure having an increased storage density to five bits per cell, thereby resulting in 32 programmable states. Similar to the above, this memory structure comprises the same fixed die size as the memory structures depicted in FIGS. 16A and 16B, thereby exhibiting an available threshold voltage ($V_{th}$) range substantially identical to that indicated in FIGS. 16A and 16B as "$\Delta V_{th}$." Correspondingly, the resulting width of the threshold voltage window per programmable state, indicated as "$\Delta V_{th,z}$," is even narrower than the width of the threshold voltage window per programmable state of the memory structures represented in FIGS. 16A and 16B (i.e., $\Delta V_{th,x} > \Delta V_{th,y} > \Delta V_{th,z}$).

As a consequence of the increased density and the tightened tolerances between the partitioned voltage ranges of multi-state memory cells, programming occurs at a progressively slower speed relative to a single-state memory cell because the data is being programmed to multiple target threshold voltage ranges and requires a higher level of resolution, or precision, during programming. As a result of the increasingly close voltage demarcations that serve to distinguish between the programmable states, programming errors occur more readily and the reliability of the programmed data becomes compromised. Therefore, with respect to memory architecture and design, there is a discernible trade-off between increasing storage density and degraded performance.

Figure 17:
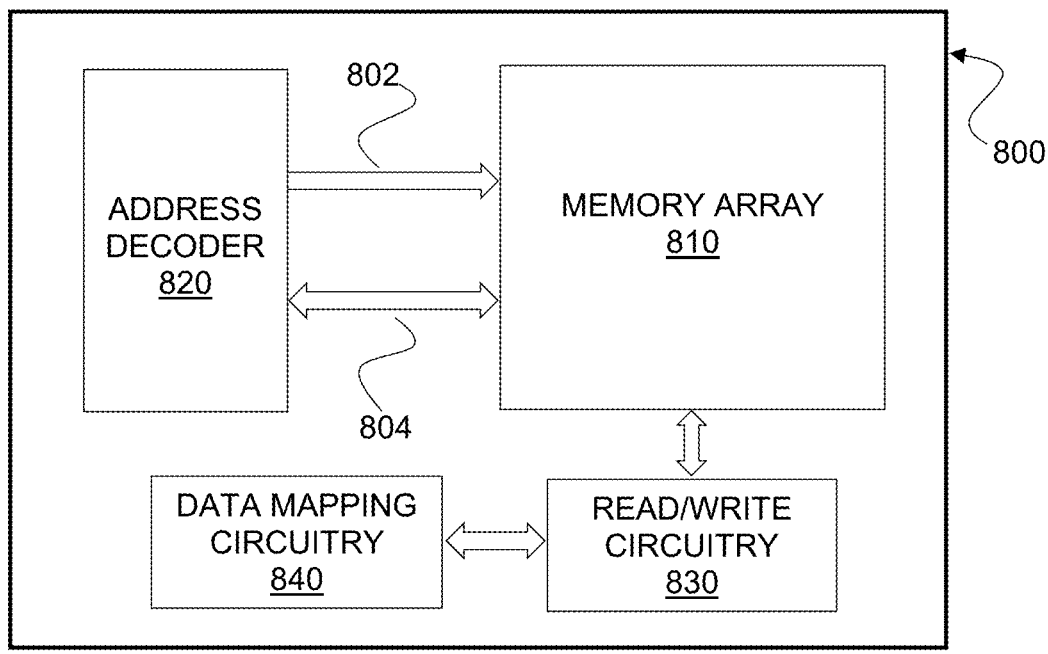
FIG. 17 is a block diagram generally depicting a non-volatile memory system, in accordance with exemplary embodiments.
Figure 18:
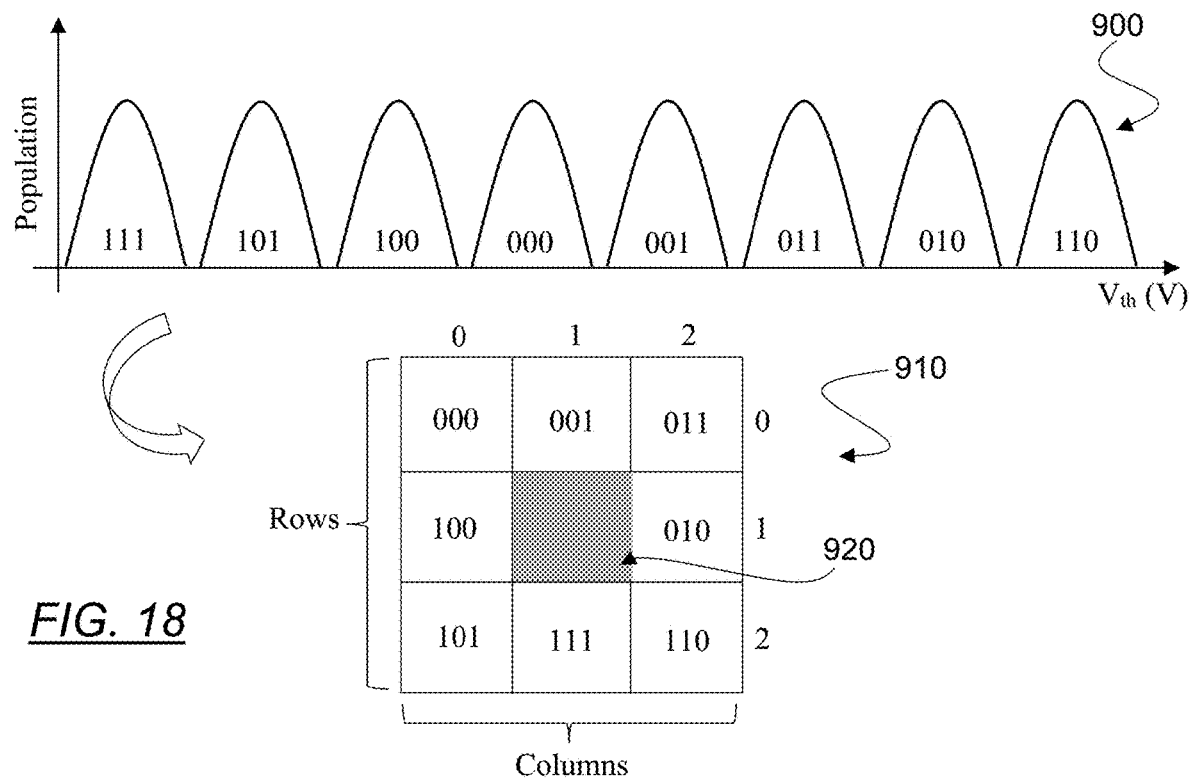
FIG. 18 depicts a joint data state map corresponding to a 1.5 fractional bits-per-cell configuration, in accordance with exemplary embodiments.

According to various exemplary embodiments, a fractional number of bits-per-cell programming scheme may be applied in order to provide an improved balance between the objectives of increased storage density and efficient and steady performance. FIG. 17 is a conceptual block diagram generally depicting a non-volatile memory system 800 according to some embodiments. In this example, system 800 comprises a memory array 810 that includes a plurality of non-volatile memory elements (e.g., cells). Further, system 800 may comprise an address decoder 820 for addressing the memory array 810 by, for example, selecting the one or more word lines (WLs) and bit lines (BLs) 802 connected to the desired memory element(s) therein. As such, data 804 can be written or read to or from memory array 810. Accordingly, system 800 may comprise read/write circuitry 830 configured to generate various bias voltages and/or currents for writing, reading, and/or erasing the memory elements of the array 810. The read/write circuitry 830 may also be configured to sense or detect the voltage and/or current of each memory element in a read memory operation. As described in detail above, each of the memory elements may be programmed to a certain programmable state among a number of programmable states or levels. With respect to certain embodiments, each memory element of memory array 800 may store a fractional number of bits. As applied herein, the meaning of the term "fractional" refers to a number that is a non-power-of two. For example, two memory elements (e.g., cells) may each be programmed to one of three levels, and the two memory elements combined can be programmed to one of nine programmable states. Therefore, the two memory elements together can store three bits of data (i.e., eight data states), with each element storing 1.5 bits (i.e., a fractional number). To illustrate, depicted in FIG. 18 is an exemplary embodiment of a 1.5 bits-per-cell configuration. Set forth in the upper portion of FIG. 18 is a representative distribution plot 900 of the threshold voltage ($V_{th}$) distribution of the eight programmable states of a population of memory elements (e.g., cells), wherein each element is programmed to store three bits. Alternatively, as demonstrated in the lower portion of FIG. 18, these same eight programmable states may instead be established using a combination of two memory elements (with each memory element storing 1.5 bits), according to a two-dimensional data mapping assignment. The lower portion of FIG. 18 depicts an example of a data mapping arrangement 910 by which all of the eight programmable states may be accomplished using a fractional number of bits (i.e., 1.5 bits) per cell configuration. The data state map 910 is accordingly based upon a pair of memory cells that are each programmed to store one of three different data states within each memory cell, wherein a "data state" is based upon the programmable threshold voltage ($V_{th}$) level(s) of the cell. Each of the "Rows" represents a different data state with respect to a first memory cell. Likewise, each "Column" represents a different data state with respect to a second memory cell. Further, each entry of the matrix comprising the data state map 910 may be referred to as a "joint data state." A "joint data state" may be defined as a state identified by combination of data states stored in each of the pair of memory cells. Thus, each joint data state indicated in the data state map 910 is associated with one of the three rows (0-2) and with one of the three columns (0-2). For example, the joint data state indicated at row "0" and column "0" (which can also be written in coordinate for as (0, 0), wherein the first number of the coordinate pair indicates the row and the second number of the coordinate pair indicates the column) is associated with the binary number "000." Likewise, the joint data state indicated at coordinates (2, 1) is associated with the binary number "111," and so forth. Thus, a joint data state map refers to, as mentioned above, a two-dimensional graphical representation of all possible joint data states for a pair of memory elements (e.g., cells) that are configured to be programmed to one of multiple different data states.

According to some embodiments, both of the memory cells that are programmed to generate a joint data state may be physically coupled to a common word line (WL), but each memory cell of the pair is coupled to a separate bit line (BL). Alternatively, the memory cells of the pair may share a common bit line (BL), but each memory cell is coupled to a separate word line (WL).

Figure 19:
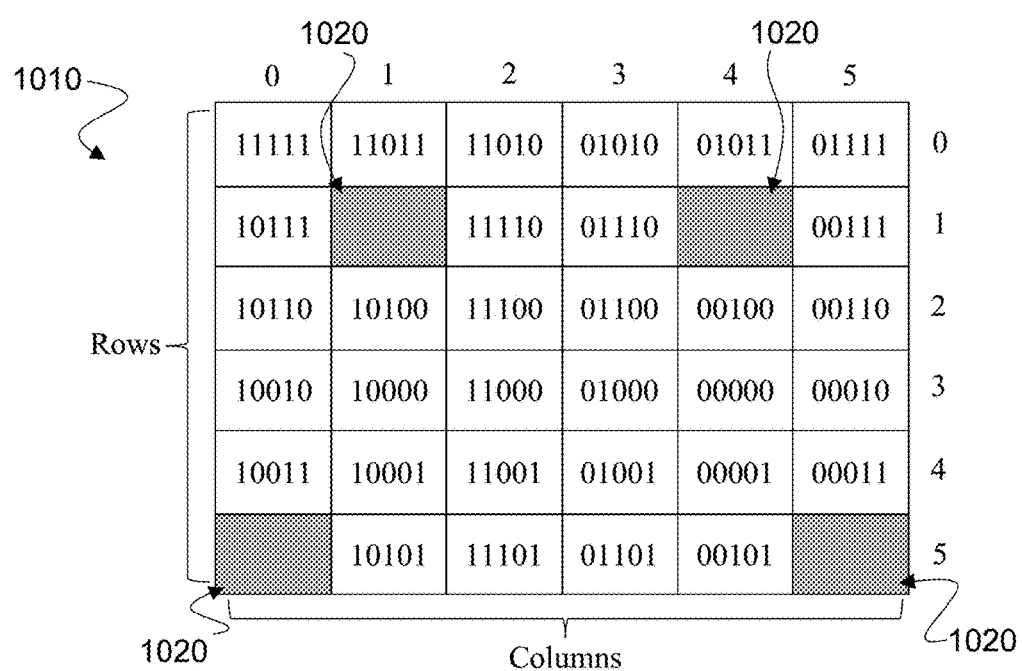
FIG. 19 depicts a joint data state map corresponding to a 2.5 fractional bits-per-cell configuration, in accordance with exemplary embodiments.
Figure 20:
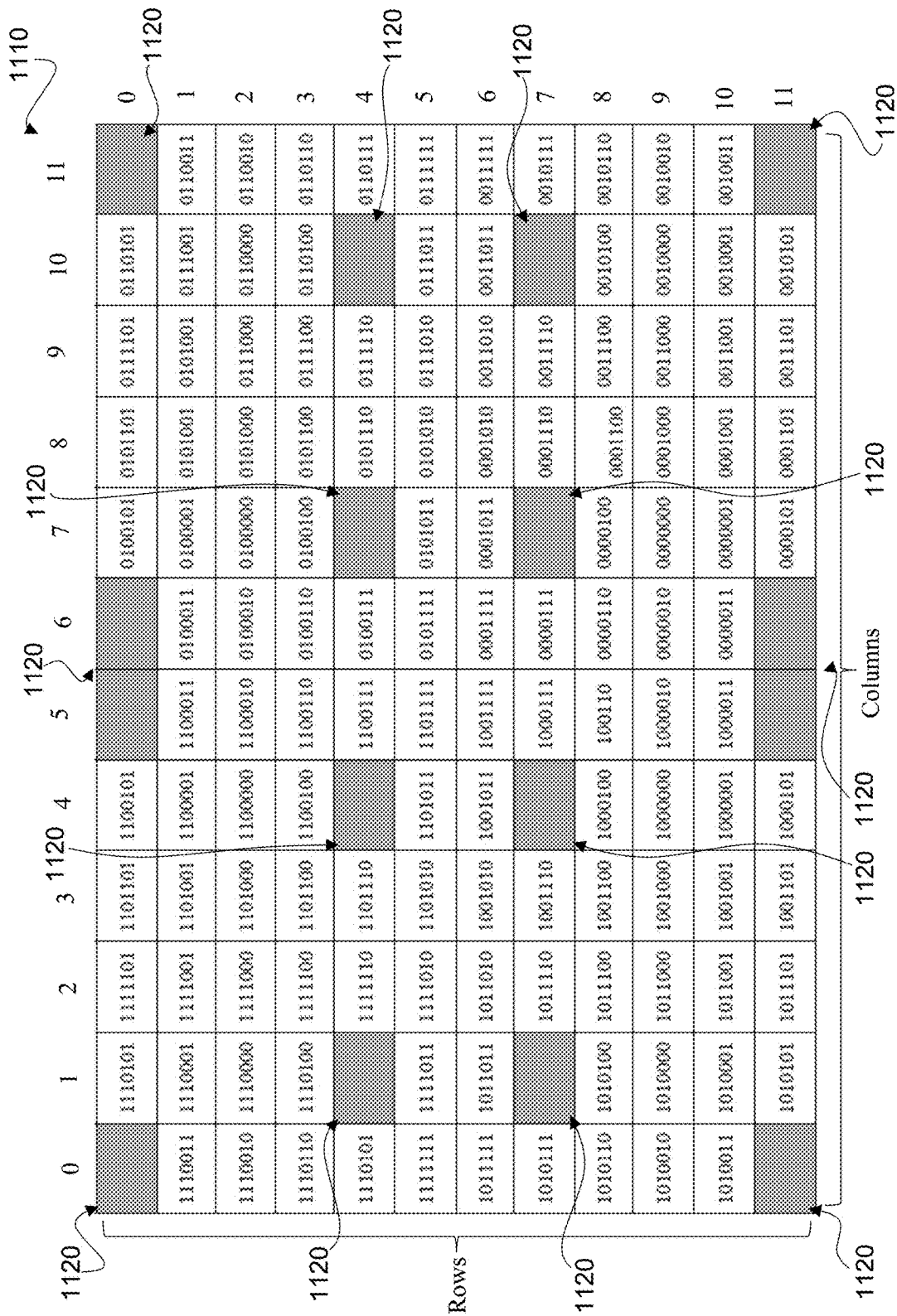
FIG. 20 depicts a joint data state map corresponding to a 3.5 fractional bits-per-cell configuration, in accordance with exemplary embodiments.

Again, the pair of memory cells that form the basis of the joint data state map 910 depicted in FIG. 18 are each configured to represent 1.5 fractional bits-per-cell with three data states in each memory cell and nine total possible joint data states. Accordingly, a 3-bit binary number encoding is associated with each joint data state. In general, a pair of memory cells programmed for "n.5" fractional bits-per-cell (wherein "n" is any integer) can store data with binary number encodings having (2×n.5) bits. Thus, when applying this logic, a 2.5 fractional bits memory cell has six possible data states and, when paired with a second memory cell with identical storage capacity, forms 36 total joint data states with a 5-bit binary number encoding associated with each joint data state. The data state map 1010 depicted in FIG. 19 illustrates an exemplary embodiment of a joint data state mapping arrangement that utilizes a pair of 2.5 fractional bits per memory cells. As shown, all 32 of the programmable states associated with a 5-bit per memory cell storage capacity are represented in the data state map 1010. Continuing further, a 3.5 fractional bits memory cell has 12 possible data states and, when combined with a second memory cell with the identical storage capacity, forms 144 total joint data states and associated with each joint data state is a 7-bit binary number encoding. FIG. 20 depicts an exemplary embodiment of one possible mapping arrangement that combines two memory cells each storing 3.5 fractional bits per cell. As shown, all of the 128 programmable states that are associated with a 7-bit memory cell storage capacity are represented in the data state map 1110. Continuing on, a memory cell that is programmed to store 4.5 fractional bits-per-cell has 24 data states, 576 total joint data states, and a 9-bit binary number encoding that is associated with each joint data state, and so forth. Further, it is possible to store a 9-bit binary number encoding by using 23 data states and a total of 529 total joint data states, according to a certain mapping assignment using a 4.5 fractional bits-per-cell programming approach.

Accordingly, by using a fractional number of bits-per-cell programming approach, the same or similar storage density of an integer bits-per-cell programming approach can still be achieved. And, advantageously, because the fractional number of bits-per-cell programming approach is conducted using a pair of memory cells programmed to a lesser fraction, a lower number of read levels per memory cell are required, thereby increasing the read speed. For example, in the circumstance illustrated according to the exemplary embodiment of FIG. 18, a memory cell programmed to store 3-bits per cell may require the application of one to four read levels depending upon the precise programmed state of the memory cell. However, as described in detail above, the same 3-bit storage density may be achieved by instead combining a pair of memory cells, wherein each cell is programmed to store only 1.5 bits per cell. As a result, only two read levels are needed per memory cell.

Further, it should be noted that in two-dimensional fractional bit data mapping assignments, only a subset of the joint data states is selected to represent user data, wherein the term "user data" may comprise any data that can be represented with binary numbers including, but not limited to, data created by a specific user or set of users, system data, host data, etc. According to some embodiments, the subset of joint data states selected to represent user data comprises $2^m$ number of joint data states, wherein "m" is an integer that is equal to the binary number of the encoding represented by each joint data state. Thus, in the example above with respect to a 1.5 fractional bits-per-cell configuration, the subset of joint data states selected to represent user data is equal to $2^3$=eight out of nine possible joint data states. Therefore, as depicted in the joint data state map 910 in FIG.

18, the remaining one joint data state 920 is not used to represent user data. This type of joint data state may be referred to as an "unused joint data state," and may be associated with an undefined (or unused) data value that is not used to represent user data. The other eight used joint data states are located in the remaining positions within the joint data state map 910 and are each associated with a defined data value used to represent user data, such as a unique 3-bit binary number, as previously discussed. In addition, according to the specific embodiment set forth in FIG. 18, each of the eight binary numbers are intentionally positioned and arranged within the joint data state map 910 such that the binary numbers of any two used joint data states that are horizontally and/or vertically adjacent to each other within the joint data state map 910 differ from each other by only one bit value. In other words, such a mapping (assignment) or an encoding scheme orders the multiple binary numbers in such a way that any two successive binary numbers along both the horizontal and vertical dimensions of a joint data state map will differ from each other by only a bit (i.e., a hamming distance of one). Accordingly, such a scheme likely reduces the magnitude of errors caused by unintentional shifts of data states between adjacent data states within a memory cell by purposefully limiting to a single bit value the number of bits that distinguish, or that change, between adjacent data states.

According to various embodiments, a further method of reducing bit error rates caused by unintentional shifts of data states between adjacent data states within a memory cell is in the manner of selecting the precise location(s) within a joint data state map for the placement of the unused joint data state(s). Consider for example, a memory cell storing a highest data state, wherein a "highest data state" may be defined as a highest physical state of a memory cell. For example, a highest data state for a memory cell that is configured to store different threshold voltage ($V_{th}$) levels corresponds to a highest threshold voltage ($V_{th}$) level (or highest threshold voltage ($V_{th}$) range) that can be stored in the cell. Such a memory cell may experience data retention issues, resulting in an unintentional downward shift of a data state. Conversely, a memory cell that stores a lowest data state, wherein a "lowest data state" may be defined as a lowest physical state of the cell (e.g., a lowest threshold voltage ($V_{th}$) level or lowest threshold voltage ($V_{th}$) range), may suffer from read and/or program disturb issues, resulting in an unintentional upward shift of a data state. Therefore, it may be beneficial to place unused joint data state(s) at certain locations within a joint data state map in order to avoid adjacent combinations of the highest data states and/or the lowest data states for each memory cell comprising the pair of memory cells.

The example joint data state maps 910, 1010, and 1110 in FIGS. 18-20 depict the application of the mechanisms described above with respect to the strategic ordering and positioning of the used joint data states and the unused joint data states (920, 1020, and 1120) therein, according to certain exemplary embodiments. However, these various embodiments are intended to be illustrative and non-limiting and other joint data state map configurations are possible that take into consideration the logical and practical mechanisms described above for fortifying data reliability.

Figure 21:
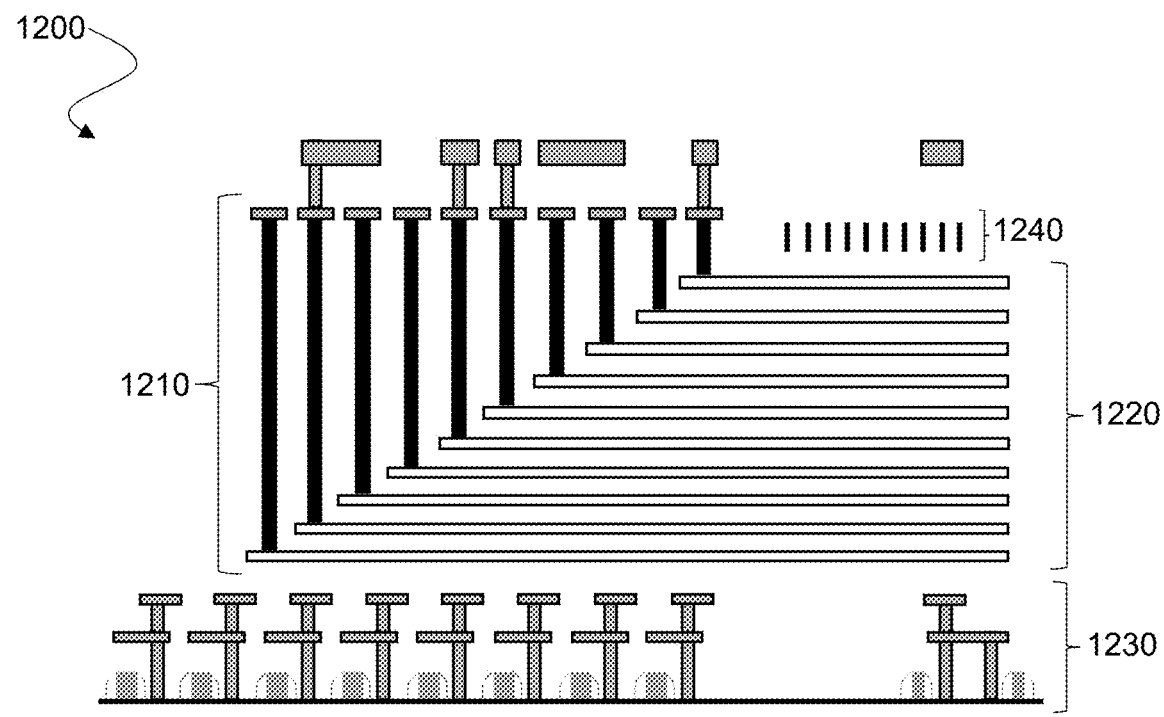
FIG. 21 schematically depicts a non-volatile memory array of a "CMOS Under the Array" type design, in accordance with an exemplary embodiment.

With respect to the fractional number of bits-per-cell programming approach, certain embodiments specify that the read level applied to both memory cells of the utilized pair be the same as a result of the construction, design, and architecture of the non-volatile memory. Consequently, this requirement constitutes a limiting factor with respect to read latency and programming speed. For example, depicted in FIG. 21 is an exemplary embodiment of a non-volatile memory array 1200. As shown, according to this particular embodiment, the memory array 1200 is comprised of a stack of three-dimensional NAND-type memory cells (or holes) constructed in the form of a "CMOS Under the Array," i.e., "CUA," type design, which is characterized by the placement of the peripheral circuitry (e.g., page buffers, sense amplifiers (S/A), charge pumps, etc.) under the vertical stack of memory cells (as opposed to alongside). Accordingly, as depicted in FIG. 21, the memory array 1200 comprises a series of word line contact holes 1210, a series of word lines (WL) 1220, and the associated peripheral circuitry positioned at the floor of the memory array 1200, wherein the peripheral circuitry comprises, for example, one or more sense amplifier(s) 1230. Further, depicted at 1240 is a series of bit lines (BL) and data bus (DBus) structure, wherein each bit line may have an associated data bus. In applying a fractional number of bits-per-cell programming scheme to a memory device that comprises, for example, the type of memory array of the exemplary embodiment 1200, the same read level is identically applied to the selected pair of memory cells.

Figure 22:
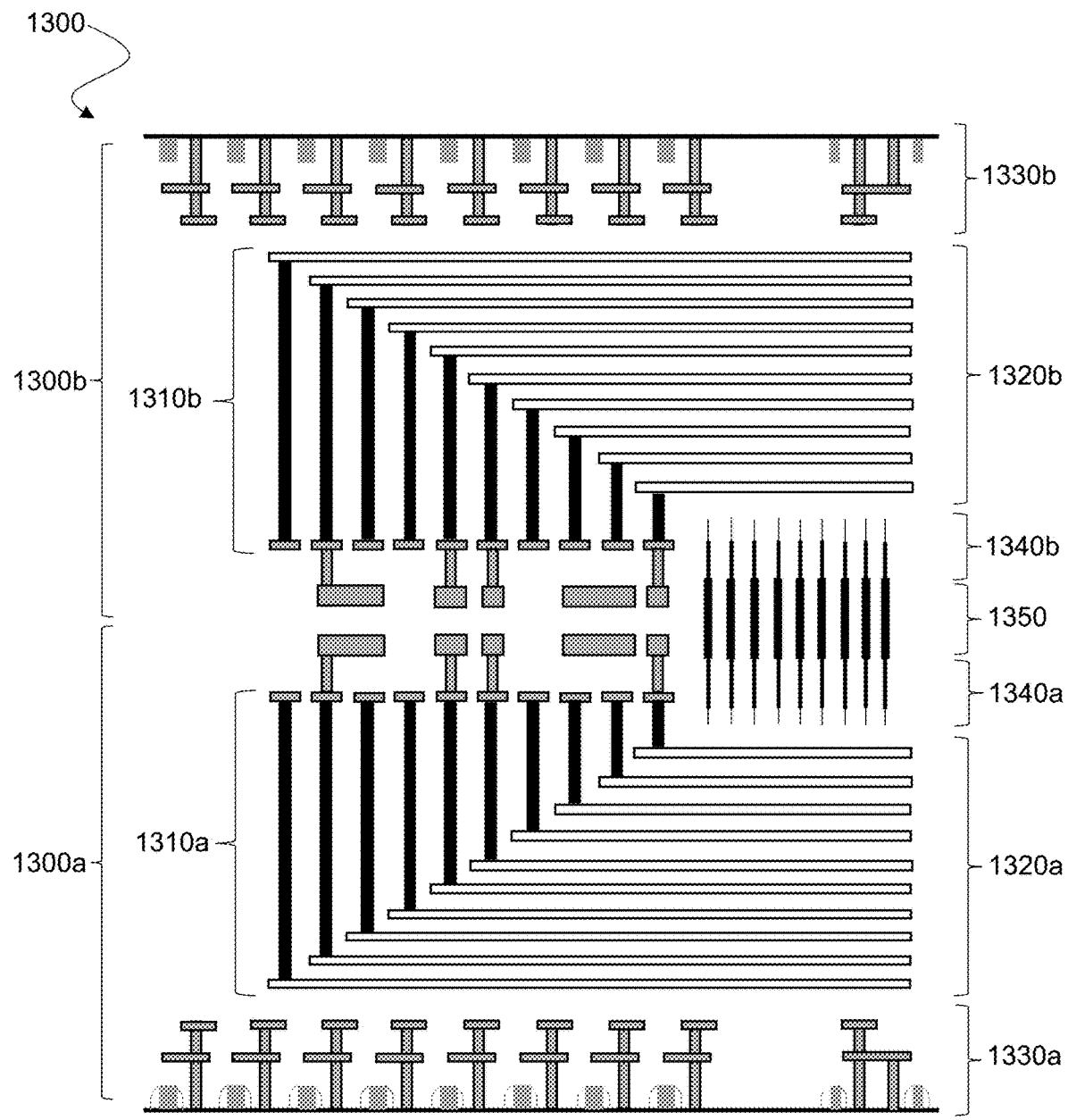
FIG. 22 schematically depicts a non-volatile memory array of a "CMOS Under the Array" type design, in accordance with another exemplary embodiment.
Figure 23A:
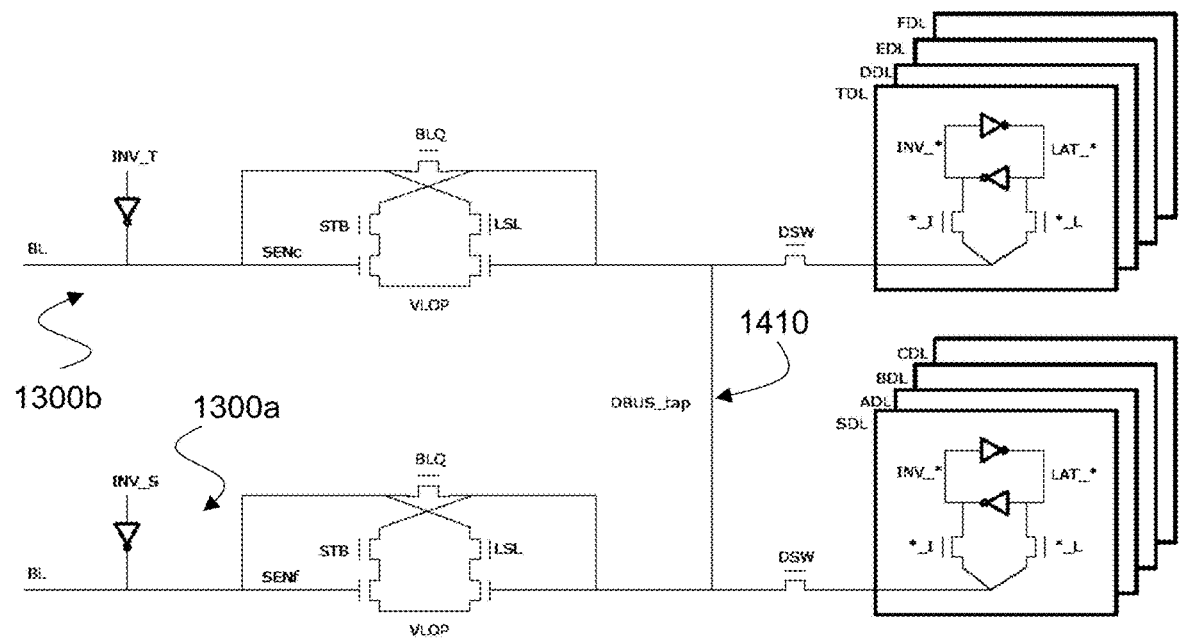
FIG. 23A is a schematic circuit diagram of a non-volatile memory array of the type depicted in FIG. 22, in accordance with exemplary embodiments.
Figure 23B:
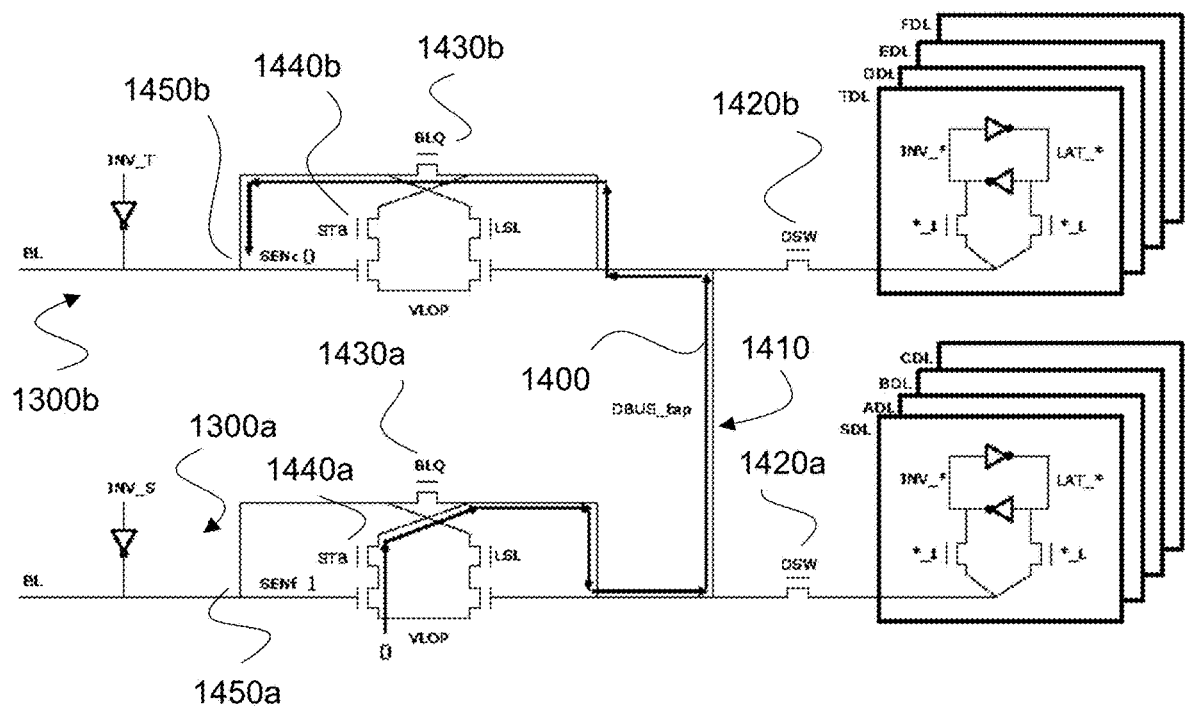
FIG. 23B is the schematic circuit diagram of FIG. 23A, and also showing an enabled electrically conductive pathway via a data bus (DBus) tap of the circuit, in accordance with exemplary embodiments.

Alternatively, shown in FIG. 22 is a further exemplary embodiment of a non-volatile memory array 1300 that, in general terms, comprises a first memory array 1300a and a second memory array 1300b. The first memory array 1300a and second memory array 1300b are comprised of the same or similar CUA-type design as the memory array 1200 (depicted in FIG. 21). However, in this particular embodiment, the second memory array 1300b is vertically inverted and disposed atop the first memory array 1300a. Accordingly, the first memory array 1300a may be referred to as the "floor" of memory array 1300, and the second memory array 1300b may be referred to as the "ceiling" of memory array 1300. Each of the first and second memory arrays (1300a, 1300b) is comprised of a series of word line contact holes and the associated data bus(es) (1340a and 1340b, respectively), a series of word lines (WL) (1320a and 1320b, respectively), and the associated peripheral circuitry (e.g., sense amplifiers (S/A) 1330a and 1330b, respectively) dedicated to its respective memory array (1300a, 1300b). Accordingly, as indicated in FIG. 22, a first series of sense amplifiers 1330a is disposed at or near the "floor" region of memory array 1300, and a second series of sense amplifiers 1330b is disposed at or near the "ceiling" region of the memory array 1300. Importantly, the first and the second memory arrays (1300a, 1300b) are electrically coupled to each other in order to operate as a contiguous memory device. With respect to this specific embodiment, each of the first memory array 1300a and second memory array 1300b comprises a bit line data bus (DBus) (1340a and 1340b, respectively), and the bit line data buses (1340a, 1340b) are then electrically coupled at region 1350 of the memory array 1300 such that they form a continuous communication pathway that interconnects the first memory array 1300a and second memory array 1300b. Various circuit configurations and bonding techniques may be employed to electrically couple the bit line data buses (1340a, 1340b) at region 1350. For example, the two bit line data buses (1340a, 1340b) could be bonded using a data bus (DBus) tap. Depicted in FIGS. 23A and 23B is a schematic diagram of an exemplary embodiment of a data bus (DBus) tap 1410, as well as the enabled electrically conductive pathway 1400 established between a first memory array 1300a (at the "floor" region) and a second memory array 1300b (at the "ceiling" region) according to a set of switch ON/OFF settings as driven by applied control gate bias(es) with respect to one or more transistors. Specifically, with respect to the particular embodiment depicted in FIGS. 23A and 23B, the circuitry shown indicates that each of the "floor" region 1300*a* and the "ceiling" region 1300*b* comprises, in part, a first transistor (1420*a* and 1420*b*, respectively), referenced as the "DSW" transistor, a second transistor (1430*a* and 1430*b*, respectively), referenced as the "BLQ" transistor, and a third transistor (1440*a* and 1440*b*, respectively), referenced as the "STB" transistor. Thus, by applying various control gate biases to these series of transistors, the electrically conductive pathway 1400 may be enabled and various SEN calculations may be utilized to provide for the ability to apply different word line biases between the first and the second memory arrays (1300*a*, 1300*b*). For example, the following logic may be applied to circuitry embodiment of FIGS. 23A and 23B. In order to enable the conductive pathway 1400, first transistors 1420*a* and 1420*b* may be biased to an OFF condition. In addition, the second transistor 1430*a* at the "floor" region may be biased to an OFF condition, whereas the second transistor 1430*b* at the "ceiling" region may be biased to an ON condition. Further, the third transistor 1440*a* at the "floor" region may be biased to an ON condition, whereas the third transistor 1440*b* at the "ceiling" region may be biased to an OFF condition. Given this specific configuration, an example of an enabled logic calculation may be described in the following manner, wherein the logic values "0" and "1" indicate the voltage level such that "0" indicates a "LOW" condition and "1" indicates a "HIGH" condition. Accordingly, as depicted in FIG. 23B, the bias ("SEN") at each of the "floor" region 1300*a* and the "ceiling" region 1300*b* (1450*a* and 1450*b*, respectively) may be defined according to the following substitution:

$$SEN_{ceiling} = SEN_{ceiling} \& \sim SEN_{floor},$$

or, inversely, $$SEN_{floor} = SEN_{floor} \& \sim SEN_{ceiling}.$$

As such, if $SEN_{ceiling}$ is equal to "1" and $SEN_{floor}$ is equal to "1," then $SEN_{ceiling}$ is equal to "0." Further, if $SEN_{ceiling}$ is equal to "1" and $SEN_{floor}$ is equal to "0", then $SEN_{ceiling}$ is equal to "1." And, if $SEN_{ceiling}$ is equal to "0" and $SEN_{floor}$ is equal to "1," then $SEN_{ceiling}$ is equal to "0." Also, if $SEN_{ceiling}$ is equal to "0" and $SEN_{floor}$ is equal to "0", then $SEN_{ceiling}$ is equal to "0." Thus, to enable the communication pathway 1400, "$SEN_{ceiling}$" should equal "0" if "$SEN_{floor}$" is equal to "1".

By electrically and structurally combining or connecting the first and second memory arrays (1300*a*, 1300*b*) to form a contiguous memory array 1300, it is then possible to apply or enable different word line biases between the first memory array 1300*a* and the second memory array 1300*b* during a programming memory operation, according to, for example, the logic equation(s) derived from the exemplary circuit embodiment of FIGS. 23A and 23B. In other words, different word line biases occurring between the first and the second memory arrays can be realized by the double CUA architecture. Specifically, each word line (WL) can be biased through its word line contact hole and the provided biases are selected by their corresponding switch (WLSW). The respective word line contact holes and WLSWs of each array (i.e., at the "ceiling" and the "floor" regions of the double CUA architecture) are prepared independently. Therefore, different word line biases may be set for each word line (WL). This ability to use a logic equation and to set different word lines biases within a double CUA structure enables an optimal read operation as discussed above. In contrast to a singular memory array embodiment (e.g., the memory array 1200 depicted in FIG. 21), it is now possible to apply a read voltage bias level that is not uniform across both memory cells within a pair of memory cells utilized in a fractional number of bits-per-cell programming approach. Rather, a first read voltage bias level may be applied to one memory cell within the memory cell pair, and a second read voltage bias level different from the first read voltage bias level may be applied to the second memory cell of the pair. As such, various improvements are made with respect to the efficiency of the memory operations, including a decline in read latency and an increase in read/programming speed.

Figure 24:
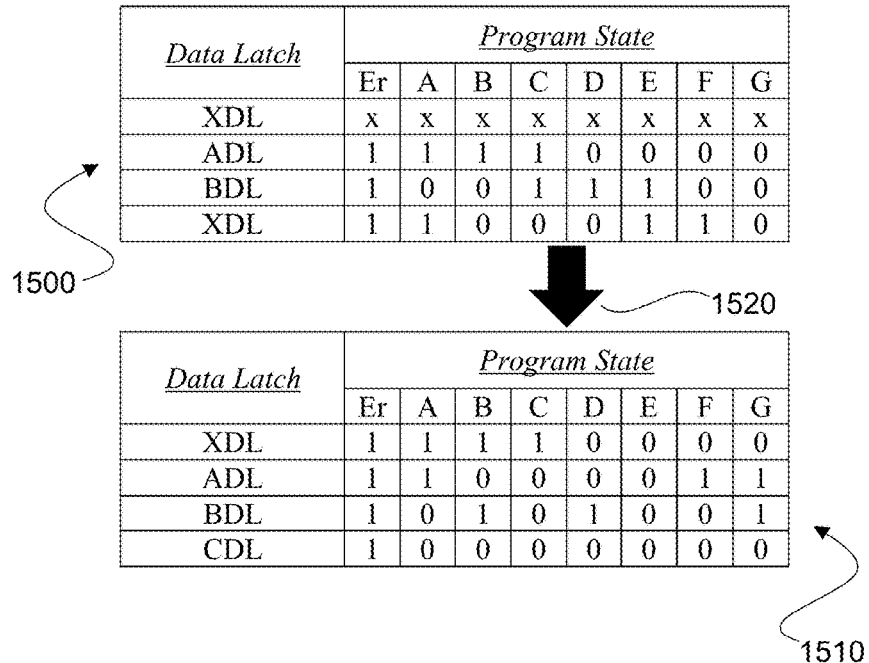
FIG. 24 generally depicts a data conversion process as performed according to a TLC-type programming scheme, in accordance with exemplary embodiments.

Still, despite the improvements made to performance parameters with respect to the read/verify memory operations by using a fractional number of bits-per-cell approach in conjunction with a double CUA architecture, it is possible that such a configuration may, in a counterproductive manner, exponentially increase the programming time ($t_{prog}$) that is consumed in data processing (e.g., data conversion) operation(s) required to conduct a program memory operation, thereby adversely affecting the programming speed and efficiency. Thus, it may be beneficial to further improve the operation of a memory structure having a double CUA architecture (e.g., such as the type depicted in FIGS. 22 and 23A-23B) in order to boost its programming performance. Typically, in program operations with respect to a non-volatile memory structure, one or more data conversion mechanisms (e.g., using internal coding) are employed to convert input data (e.g., from a user/host) into data that may be effectively programmed in the memory. As described above, a data conversion processes may involve temporarily and/or permanently transferring and storing data within one or more data latches (DLs). For example, depicted in FIG. 24 is one exemplary embodiment of a possible data conversion operation with respect to a TLC NAND-type memory cell. As such, three pages of input data are depicted at 1500 and in relation to the eight programmable data states (i.e., states "A" through "G" and an "erased" state) that are characteristic of a TLC-type memory cell. Accordingly, each page is stored within a respective data latch (referenced as ADL, BDL, and CDL in FIG. 24). Depicted at 1510 is programmed data that is representative of the input data 1500 subsequent to a data conversion operation 1520. According to this particular example, a transfer data latch (referenced as XDL in FIG. 24) is utilized in order to achieve the data conversion. In various embodiments, this data conversion process is performed according to a conversion operation sequence conducted using one or more sense amplifiers (comprising the peripheral circuitry) and in conjunction with one or more data latches (DLs) comprising the memory device.

Figure 25:
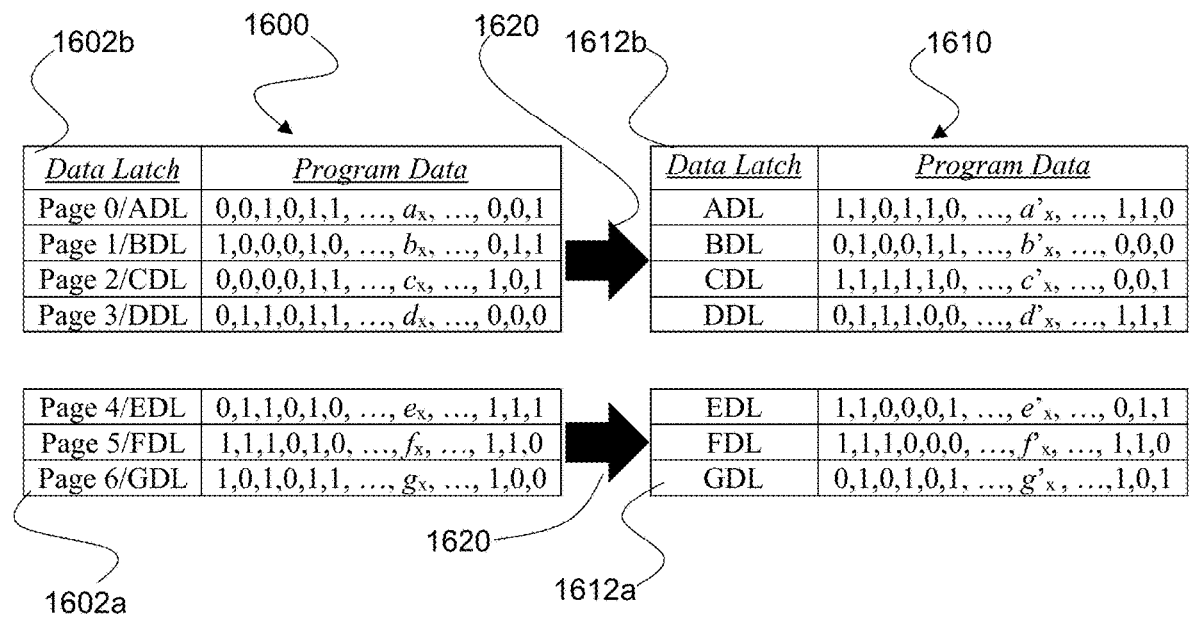
FIG. 25 generally depicts a data conversion process as performed according to a 3.5 fractional number of bits-per-cell programming scheme, in accordance with an exemplary embodiment.

Comparatively, FIG. 25 illustrates an exemplary embodiment of a conceivable data conversion operation with respect to a 3.5 fractional number of bits-per-cell programming approach that is applied to a double CUA memory array architecture (such as the embodiment depicted in FIGS. 22 and 23A-23B). As such, shown at 1600 is an illustrative example of input data (e.g., from a user/host), which is comprised of seven total pages of input data (that is referenced as "Page 0," "Page 1," . . . , "Page 6") stored within a series of data latches (DLs) (referenced as ADL, BDL, CDL, DDL, EDL, FDL, and GDL in FIG. 25). More specifically, a first set of data input 1602*a* (that is associated with the "floor" region of the double CUA architecture) is stored within data latches EDL, FDL, and GDL, and a second set of data input 1602*b* (associated with the "ceiling"

region of the double CUA architecture) is similarly stored within data latches ADL, BDL, CDL, and DDL. Further, depicted at 1610 is programmed data that is representative of the input data 1600 and results from a data conversion operation 1620, which is then rewritten to the respective data latches ADL, BDL, CDL, DDL, EDL, FDL, and GDL of the double CUA architecture (see 1612*a* and 1612*b*). Importantly, although this 3.5 fractional bits-per-cell approach results in a storage capacity increase of only 0.5 bits per cell relative to a TLC-type (3 bits-per-cell) programming scheme, there is, correspondingly, an outsized increase in the number of pages (from three to seven pages) that are needed to store the data in order to conduct the requisite data processing operations (e.g., a data conversion). According to certain experimental data/observations, due to this disproportionate increase in the number of pages of data, the data processing operation sequences that are performed within the peripheral circuitry become extensively longer in connection with the fractional number of bits-per-cell programming approach. As a result, there may be a drastic and rapid increase in the programming time ($t_{prog}$) that, in some circumstances, may be exponential in nature, thereby limiting and downgrading the performance efficiency and the overall usefulness of the memory device.

Figure 26:
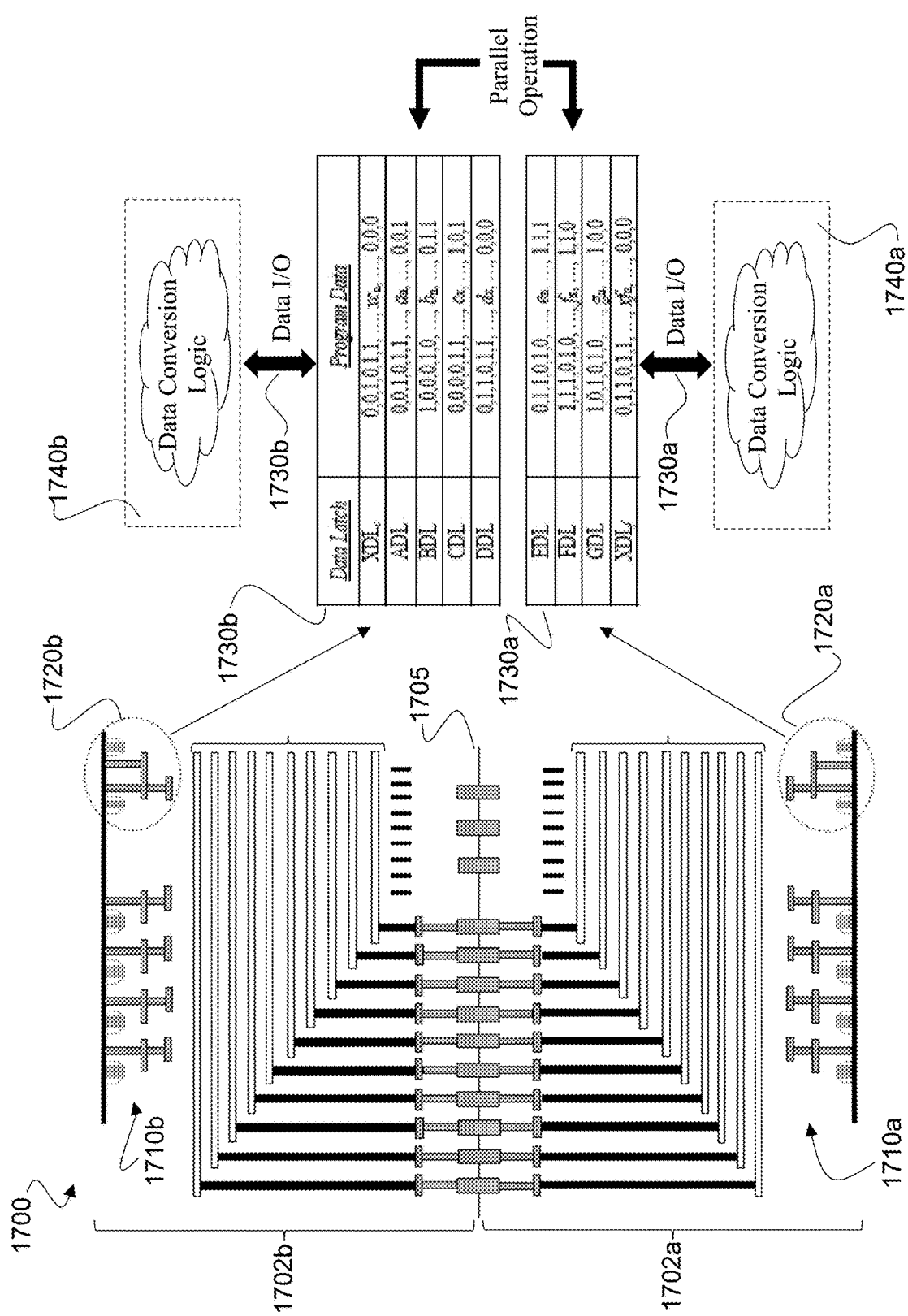
FIG. 26 generally depicts a data conversion process as performed according to a 3.5 fractional number of bits-per-cell programming scheme, in accordance with another exemplary embodiment.
Figure 27:
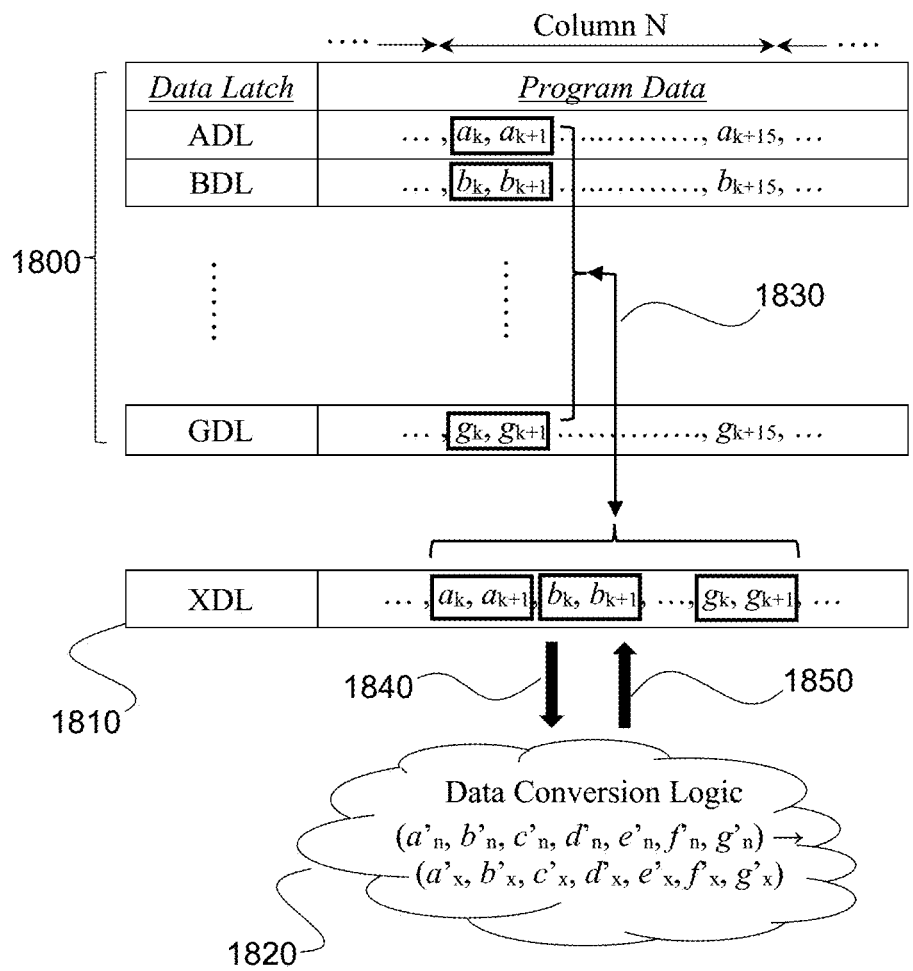
FIG. 27 depicts in greater detail a portion of the data conversion process that is demonstrated in FIG. 26.
Figure 28:
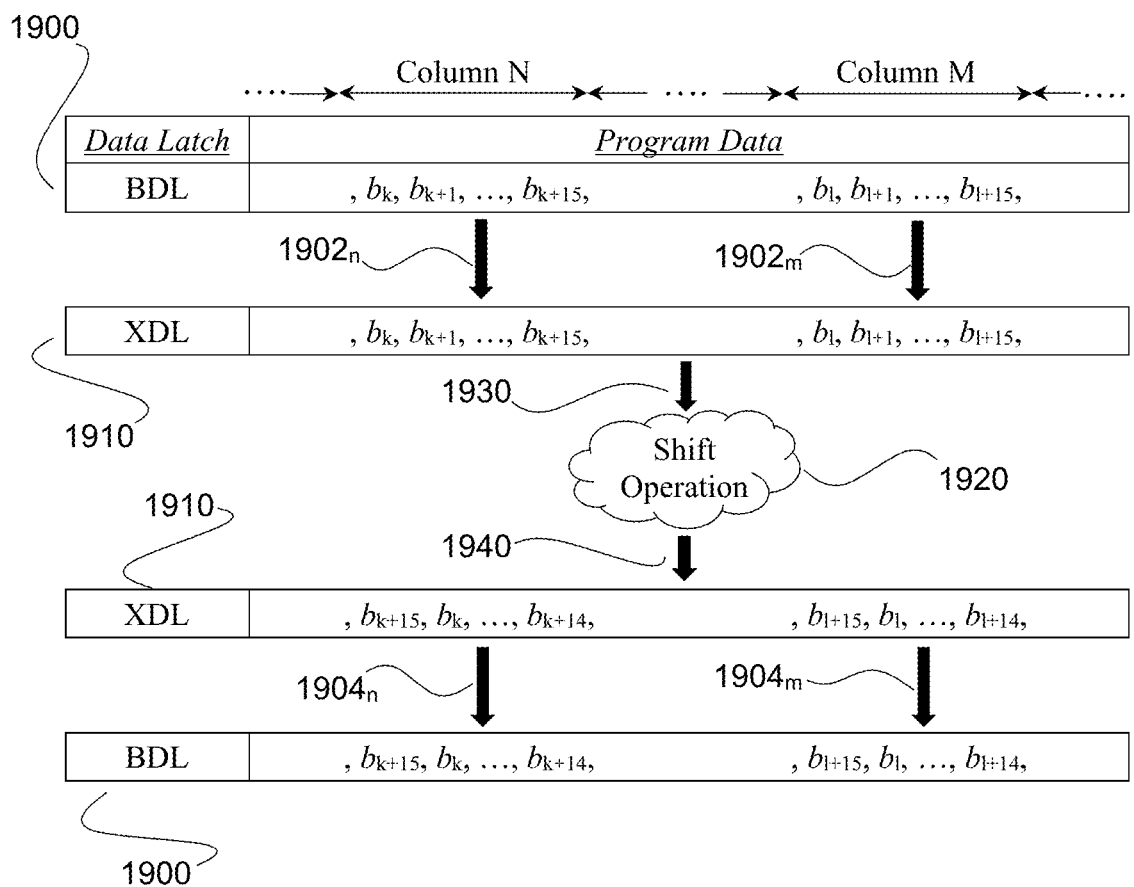
FIG. 28 generally depicts a data shifting process as performed in accordance with the data conversion process that is demonstrated in FIGS. 26-27.

Referring now to FIGS. 26-28, there is depicted an exemplary embodiment of a data conversion configuration and method that aims to improve the programming efficiency when applying a fractional number of bits-per-cell programming approach. For illustrative purposes only, a 3.5 fractional bits-per-cell programming approach is assumed according to the following description.

Beginning at FIG. 26, depicted on the left-hand side is an example memory structure 1700 having a double CUA architecture. At a "floor" region of the memory structure 1700 is a first memory array 1702*a*, wherein the peripheral circuitry 1710*a* is positioned below in relation to the memory cells of the array 1702*a*. Further, at a "ceiling" region of the memory structure 1700 is a second memory array 1702*b*. The structure of the second memory array 1702*b* may be identical to the first memory array 1702*a* but may be vertically inverted such that the peripheral circuitry 1710*b* of the second memory array 1702*b* is instead positioned above relative to the memory cells of the array 1702*b*. In such a configuration, the first memory array 1702*a* and the second memory array 1702*b* are electrically connected by, for example, bonding their respective bit line data buses via a data bus (DBus) tap 1705. A section (1720*a*, 1720*b*) of the peripheral circuitry of each of the first and second memory arrays (1702*a*, 1702*b*) comprises one or more sense amplifiers (SA) and a data path (DP) circuit.

Further, generally depicted in some detail at the right-hand side of FIG. 26 is a data conversion operation as performed by the peripheral circuitry (1720*a*, 1720*b*) of the first and second memory arrays (1702*a*, 1702*b*) of memory structure 1700. Specifically, at 1730*a*, input data stored in first memory array 1702*a* according to a 3.5 fractional bits-per-cell programming approach is stored, for example, in a series of data latches EDL, FDL, and GDL. Similarly, at 1730*b*, input data that is accordingly stored in the second memory array 1702*b* is stored, for example, in a series of data latches ADL, BDL, CDL, and DDL. Further, the data latches EDL, FDL, and GDL are communicatively coupled to the data path circuit 1740*a* of the peripheral circuitry 1720*a* of the first memory array 1702*a* via a data input/output connection 1730*a*. Likewise, the data latches ADL, BDL, CDL, and DDL are communicatively coupled to the data path circuit 1740*b* of the peripheral circuitry 1720*b* of the second memory array 1702*b* using a data input/output connection 1730*b*. As indicated in FIG. 26, each data path circuit (1740*a* and 1740*b*) comprises a data conversion logic that, during the data processing step(s) that are performed during a programming operation, is applied to the data that is stored within the data latch series communicatively coupled to the data path circuit. Once the data conversion is complete, the converted data may then be rewritten to the data latches. As such, one or more transfer data latches may be used to temporarily and/or to permanently store data in order to facilitate the data conversion process (see e.g., the transfer data latches $XDL_c$ and $XDL_f$ in FIG. 26). Importantly, due to the dual, but combined, nature of the first and second memory arrays (1702*a* and 1702*b*), with each memory array having its own dedicated series of data latches and peripheral circuitry (including a respective data path circuit 1740*a*, 1740*b*), the efficiency of the data conversion process is significantly and markedly improved as the two data path circuits (1740*a*, 1740*b*) may operate in parallel and without the use of the sense amplifier circuitry to process the input data.

Referring now to FIG. 27, there is demonstrated, in greater detail, a data conversion operation or process according to, for example, the exemplary embodiment depicted in FIG. 26. For purposes of simplicity and illustration, the data conversion process depicted in FIG. 27 is shown with respect to only a single and non-limiting representative example column of data (referenced as "Column N"). However, each column of data undergoing the data conversion process may undergo the identical process and is treated in the same manner as the data that is within "Column N." The multiple columns may be processed in a serial order. As indicated in FIG. 27, stored in each data latch (i.e., data latches ADL, BDL, . . . , GDL) is the input data 1800 that is being stored in a memory structure having a double CUA architecture (e.g., memory structure 1700). Recalling that, in this particular example, a 3.5 fractional bits-per-cell programming approach is being implemented, each set of the input data 1800 comprises a joint data state of two memory cells. Therefore, for purposes of general reference in FIG. 27, in "Column N," the input data stored in data latch "ADL" comprises 16 data bits, "$a_k$," "$a_{k+1}$," . . . , "$a_{k+15}$," wherein "k" is any integer. Likewise, with respect to the remaining data latches "BDL" through "GDL," the input data being stored with respect to each data column also comprises 16 data bits (e.g., when applying the same nomenclature, bits "$b_k$," "$b_{k+1}$," . . . , "$b_{k+15}$," "$c_k$," "$c_{k+1}$," . . . , "$c_{k+15}$," . . . , and so on.)

To begin the data conversion process, for each column of data, the data bits 1800 from each data latch "ADL" through "GDL" are copied to one or more transfer data latches 1810 ("XDL") of the peripheral circuitry of the memory structure (see 1830). According to certain embodiments, this initial copying operation may be conducted by copying to the transfer data latch(es) just a subset at a time of the data bits from each data latch. For example, in the embodiment shown in FIG. 27, only a two-data bit fragment (i.e., "$a_k$," "$a_{k+1}$," "$b_k$," "$b_{k+1}$," . . . , "$g_k$," and "$g_{k+1}$") from each of the data latches "ADL" through "GDL" is copied at one time into the one or more transfer data latches 1810. Once the full input data of each column is copied to the one or more transfer data latches, the transferred input data is then read out (see 1840) to a respective data path (DP) circuit 1820 (see also 1740*a* and 1740*b* in FIG. 26). At the data path circuit 1820, data conversion logic is applied to the data in order to convert the data into a corresponding 7-bit binary value to be programmed and that is representative of the associated input data. Once the data conversion process at the data path circuit 1820 is complete, the converted data is then read back (see 1850) into the one or more transfer data latches 1810. Thereafter, the converted data is re-programmed into the several data latches "ADL" through "GDL."

According to certain embodiments, the converted data may be rewritten back to the original data latch location of the associated input data. To accomplish this task, a data shifting operation subsequent to, or in conjunction with, the data conversion process may be required. Referring now to FIG. 28, there is depicted an exemplary embodiment of such a data shifting operation or process. For purposes of simplicity and demonstration, FIG. 28 provides only a snapshot of the data shifting operation as being applied to two data columns, "Column N" and "Column M," and with respect to only the data stored in a single data latch 1900 (i.e., "BDL"). Further, the illustration in FIG. 28 assumes the same 3.5 fractional bits-per-cell programming approach as the non-limiting basis for demonstration in FIGS. 26 and 27. Accordingly, in this particular embodiment, at an initial step, 16 data bits are being stored in the data latch 1900 with respect to each of "Column N" and Column "M". For general reference, the 16 data bits stored within data latch 1900 with respect to "Column N" are indicated in FIG. 28 as "$b_k$," "$b_{k+1}$," . . . , "$b_{k+15}$," and the 16 data bits stored within the data latch 1900 with respect to "Column M" are similarly indicated in FIG. 28 as "$b_l$," "$b_{l+1}$," . . . , "$b_{l+15}$," wherein "k" and "l" are any integer. To begin a data shifting operation, the data stored in each data latch is fully copied to one or more transfer data latches 1910 ("XDL"). Importantly, in performing this copying process, the data stored within each data column is never commingled with the data from another data column. Rather, the data of each data column is kept separate and independent from the data of any other column during the copying or the transferring process (as indicated at, for example, 1902$_n$ and 1902$_m$ in FIG. 28). Thereafter, the copied or transferred data is read out (see 1930) from the one or more transfer data latches 1910 to a respective data path (DP) circuit 1920 (see also 1740a, 1740b in FIG. 26). At the data path (DP) circuit 1920, shift logic is subsequently applied to the stored data, wherein the shift logic may comprise any suitable algorithmic process (or set of algorithmic processes) that modifies the relative sequence or positioning of the newly converted data bits according to a desired result. According to certain exemplary embodiments, the shift logic is applied to each data column independently. In the particular embodiment shown in FIG. 28, the shift logic applied operates as a right circular shift of one data bit with respect to each column.

After the shift operation is complete, the shifted data is read back out (see 1940) to the one or more transfer data latches 1910 and is correspondingly rewritten to the same initial data latch location (e.g., 1900). Again, during the rewriting of the shifted data bits back to the same data latch location, the data bits within each data column are continuously maintained in that column such that data is never shifted, nor commingled, between the data columns (as indicated at, for example, 1904$_n$ and 1904$_m$ in FIG. 28).

According to certain embodiments, the data conversion and the shift logic circuitry implementation is carried out in the data path circuit location of the memory device. Further, regarding the data I/O channel(s) by which data is transferred in and out of the one or more transfer data latches ("XDL"), such an implementation may comprise a data I/O clock and pointer control logic.

Thus, in summary, applying a data conversion process and a data shifting process (subsequent to or in conjunction with the data conversion process) that employs, in parallel operation, respective data path circuits of a memory device having a double CUA architecture, improves the programming efficiency of a fractional number of bits-per-cell programming approach.

The above discussion is meant to be illustrative of the principles and various embodiments of the present disclosure. Numerous variations and modifications will become apparent to those skilled in the art once the above disclosure is fully appreciated. For example, although on-memory controllers are described as performing or controlling the exemplary embodiments set forth above, any processor that executes software within a host system can perform the exemplary embodiments described above without departing from the scope of the disclosure. In particular, the methods and the techniques that are described herein as being performed in the on-memory controller(s), may also be performed in a host. Furthermore, the methods and the concepts disclosed herein may be applied to other types of persistent memories other than flash. It is intended that the following claims be interpreted to embrace all such variations and modifications.

What is claimed is:

1. A method for programming a non-volatile memory structure, comprising:
   initiating a two-dimensional fractional number of bits-per-cell programming scheme with respect to a plurality of memory cells of the memory structure, the memory structure comprising:
      a first memory array comprising a first population of the plurality of memory cells and associated peripheral circuitry, wherein the associated peripheral circuitry is disposed below the first population of the plurality of memory cells;
      a second memory array:
         positioned above the first memory array; and
         comprising a second population of the plurality of memory cells and associated peripheral circuitry, wherein the associated peripheral circuitry is disposed above the second population of the plurality of memory cells;
      a data bus tap electrically coupling the first memory array and the second memory array;
   storing input data:
      in a first set of data latches associated with the first memory array; and
      in a second set of data latches associated with the second memory array;
   converting the input data stored in the:
      first set of data latches and the second set of data latches using data conversion logic implemented by a data path circuit of the peripheral circuitry associated with the first memory array; and
      first set of data latches and the second set of data latches using data conversion logic implemented by a data path circuit of the peripheral circuitry associated with the second memory array; and
   rewriting the converted data to:
      the first set of data latches; and
      the second set of data latches.

2. The method according to claim 1, wherein implementation of the data conversion logic by the data path circuit associated with the first memory array occurs concurrently with implementation of the data conversion logic by the data path circuit associated with the second memory array.

3. The method according to claim 1, wherein prior to converting the input data, transferring the input data stored in the first set of data latches and the second set of data latches to at least:
   one transfer data latch associated with the peripheral circuitry of the first memory array; and
   one transfer data latch associated with the peripheral circuitry of the second memory array.

4. The method according to claim 1, wherein the converted data is in the form of bit-value data representative of the input data.

5. The method according to claim 1, wherein each segment of the converted data:
   is representative of a correlating segment of the input data: and
   is rewritten to the same data latch in which the correlating segment of the input data was stored.

6. The method according to claim 1, further comprising:
   prior to rewriting the converted data, shifting the converted data associated with:
      the first set of data latches using shift logic implemented by a data path circuit of the peripheral circuitry associated with the first memory array; and
      the second set of data latches using shift logic implemented by a data path circuit of the peripheral circuitry associated with the second memory array.

7. A memory controller, comprising:
   a first communication pathway configured to couple to a non-volatile memory structure; and
   the memory controller configured to:
      initiate a two-dimensional fractional number of bits-per-cell programming scheme with respect to a plurality of memory cells of the memory structure, the memory structure comprising:
         a first memory array comprising a first population of the plurality of memory cells and associated peripheral circuitry, wherein the associated peripheral circuitry is disposed below the first population of the plurality of memory cells;
         a second memory array:
            positioned above the first memory array; and
            comprising a second population of the plurality of memory cells and associated peripheral circuitry, wherein the associated peripheral circuitry is disposed above the second population of the plurality of memory cells;
         a data bus tap electrically coupling the first memory array and the second memory array;
      store input data:
         in a first set of data latches associated with the first memory array; and
         in a second set of data latches associated with the second memory array;
      convert the input data stored in the:
         first set of data latches and the second set of data latches using data conversion logic implemented by a data path circuit of the peripheral circuitry associated with the first memory array; and
         first set of data latches and the second set of data latches using data conversion logic implemented by a data path circuit of the peripheral circuitry associated with the second memory array; and
      rewrite the converted data to:
         the first set of data latches; and
         the second set of data latches.

8. The memory controller according to claim 7, wherein implementation of the data conversion logic by the data path circuit associated with the first memory array occurs concurrently with implementation of the data conversion logic by the data path circuit associated with the second memory array.

9. The memory controller according to claim 7, wherein prior to converting the input data, the memory controller is configured to transfer the input data stored in the first set of data latches and the second set of data latches to at least:
   one transfer data latch associated with the peripheral circuitry of the first memory array; and
   one transfer data latch associated with the peripheral circuitry of the second memory array.

10. The memory controller according to claim 7, wherein the converted data is in the form of bit-value data representative of the input data.

11. The memory controller according to claim 7, wherein each segment of the converted data:
   is representative of a correlating segment of the input data: and
   is rewritten to the same data latch in which the correlating segment of the input data was stored.

12. The memory controller according to claim 7, further comprising:
   the memory controller is configured to, prior to rewriting the converted data, shift the converted data associated with:
      the first set of data latches using shift logic implemented by a data path circuit of the peripheral circuitry associated with the first memory array; and
      the second set of data latches using shift logic implemented by a data path circuit of the peripheral circuitry associated with the second memory array.

13. The memory controller according to claim 7, wherein the two-dimensional fractional number of bits-per-cell programming scheme is an "n.5" bits-per-cell programming scheme, wherein "n" is any integer.

14. A non-volatile memory system, comprising:
   a memory structure, comprising:
      a first memory array comprising a first population of a plurality of memory cells of the memory structure and associated peripheral circuitry, wherein the associated peripheral circuitry is disposed below the first population of the plurality of memory cells;
      a second memory array:
         positioned above the first memory array; and
         comprising a second population of the plurality of memory cells and associated peripheral circuitry, wherein the associated peripheral circuitry is disposed above the second population of the plurality of memory cells; and
      a data bus tap electrically coupling the first memory array and the second memory array; and
   a memory controller coupled to the memory structure and:
      initiating a two-dimensional fractional number of bits-per-cell programming scheme with respect to the plurality of memory cells;
      storing input data:
         in a first set of data latches associated with the first memory array; and
         in a second set of data latches associated with the second memory array;
      converting the input data stored in the:
         first set of data latches and the second set of data latches using data conversion logic implemented by a data path circuit of the peripheral circuitry associated with the first memory array; and first set of data latches and the second set of data latches using data conversion logic implemented by a data path circuit of the peripheral circuitry associated with the second memory array; and rewriting the converted data to:
the first set of data latches; and
the second set of data latches.

15. The non-volatile memory system according to claim 14, wherein implementation of the data conversion logic by the data path circuit associated with the first memory array occurs concurrently with implementation of the data conversion logic by the data path circuit associated with the second memory array.

16. The non-volatile memory system according to claim 14, further comprising the memory controller, prior to converting the input data, transferring the input data stored in the first set of data latches and the second set of data latches to at least:

one transfer data latch associated with the peripheral circuitry of the first memory array; and one transfer data latch associated with the peripheral circuitry of the second memory array.

17. The non-volatile memory system according to claim 14, wherein the converted data is in the form of bit-value data representative of the input data.

18. The non-volatile memory system according to claim 14, wherein each segment of the converted data:
is representative of a correlating segment of the input data: and
is rewritten to the same data latch in which the correlating segment of the input data was stored.

19. The non-volatile memory system according to claim 14, further comprising the memory controller, prior to rewriting the converted data, shifting the converted data associated with:

the first set of data latches using shift logic implemented by a data path circuit of the peripheral circuitry associated with the first memory array; and the second set of data latches using shift logic implemented by a data path circuit of the peripheral circuitry associated with the second memory array.

20. The non-volatile memory system according to claim 14, wherein the two-dimensional fractional number of bits-per-cell programming scheme is an "n.5" bits-per-cell programming scheme, wherein "n" is any integer.

* * * * *